US010295903B2

(12) United States Patent
Hatakeyama et al.

(10) Patent No.: US 10,295,903 B2
(45) Date of Patent: May 21, 2019

(54) SUBSTRATE PROCESSING METHOD, SUBSTRATE PROCESSING APPARATUS AND STORAGE MEDIUM

(71) Applicant: Tokyo Electron Limited, Tokyo (JP)

(72) Inventors: Shinichi Hatakeyama, Kumamoto (JP); Masanobu Watanabe, Kumamoto (JP); Kouzo Nishi, Kumamoto (JP); Seiya Totsuka, Kumamoto (JP); Kentaro Yoshihara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 80 days.

(21) Appl. No.: 15/682,750

(22) Filed: Aug. 22, 2017

(65) Prior Publication Data

US 2018/0059539 A1 Mar. 1, 2018

(30) Foreign Application Priority Data

Aug. 25, 2016 (JP) ................................ 2016-164863
Apr. 25, 2017 (JP) ................................ 2017-086393

(51) Int. Cl.

*G03F 7/00* (2006.01)
*G03F 7/20* (2006.01)
*H01L 21/67* (2006.01)
*G03F 7/16* (2006.01)

(52) U.S. Cl.

CPC ............ *G03F 7/0027* (2013.01); *G03F 7/162* (2013.01); *G03F 7/70433* (2013.01); *H01L 21/6715* (2013.01); *H01L 21/67017* (2013.01); *H01L 21/67253* (2013.01)

(58) Field of Classification Search

CPC ..... G03F 7/0027; G03F 7/162; H01L 21/6708
See application file for complete search history.

(56) References Cited

U.S. PATENT DOCUMENTS

2008/0107796 A1* 5/2008 Cho .................... B05C 11/1013 427/8

FOREIGN PATENT DOCUMENTS

JP 2016-010796 A 1/2016

* cited by examiner

*Primary Examiner* — Minh Q Phan
(74) *Attorney, Agent, or Firm* — Abelman, Frayne & Schwab

(57) ABSTRACT

A substrate processing apparatus according to the present disclosure includes: a nozzle that ejects a processing liquid to a wafer; a force-feeding unit that force-feeds the processing liquid to the nozzle side; a liquid feeding pipeline that includes first and second valves and guides the processing liquid from the force-feeding unit to the nozzle; and a controller. The controller is configured to perform opening the first valve in a state where the second valve is closed and a pressure between the first and second valves is higher than a pressure between the force-feeding unit and the first valve, controlling the force-feeding unit to increase the pressure between the first and second valves that has been decreased by the opening of the first valve, and opening the second valve after the pressure between the first and second valves is decreased by the opening of the first valve.

22 Claims, 16 Drawing Sheets

SUBSTRATE PROCESSING METHOD, SUBSTRATE PROCESSING APPARATUS AND STORAGE MEDIUM

CROSS-REFERENCE TO RELATED APPLICATIONS

This application is based on and claims priority from Japanese Patent Application Nos. 2016-164863 and 2017-086393, filed on Aug. 25, 2016 and Apr. 25, 2017, respectively, with the Japan Patent Office, the disclosures of which are incorporated herein in their entirety by reference.

TECHNICAL FIELD

The present disclosure relates to a substrate processing apparatus, a substrate processing method, and a storage medium.

BACKGROUND

Japanese Patent Laid-Open Publication No. 2016-010796 discloses a liquid coating method which spirally coats a coating liquid on the front surface of a substrate by ejecting the coating liquid from an ejection nozzle while moving the ejection nozzle between the rotation axis and the peripheral edge of the substrate during the rotation of the substrate.

SUMMARY

According to an aspect of the present disclosure, a substrate processing apparatus includes: a nozzle that ejects a processing liquid to a substrate; a force-feeding unit that force-feeds the processing liquid to the nozzle side; a liquid feeding pipeline that includes first and second valves arranged from the force-feeding unit side toward the nozzle side and guides the processing liquid from the force-feeding unit to the nozzle; and a controller, wherein the controller is configured to perform opening the first valve in a state where the second valve is closed and a pressure between the first and second valves is higher than a pressure between the force-feeding unit and the first valve; controlling the force-feeding unit to increase the pressure between the first and second valves that has been decreased by the opening of the first valve; and opening the second valve after the pressure between the first and second valves is decreased by the opening of the first valve.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
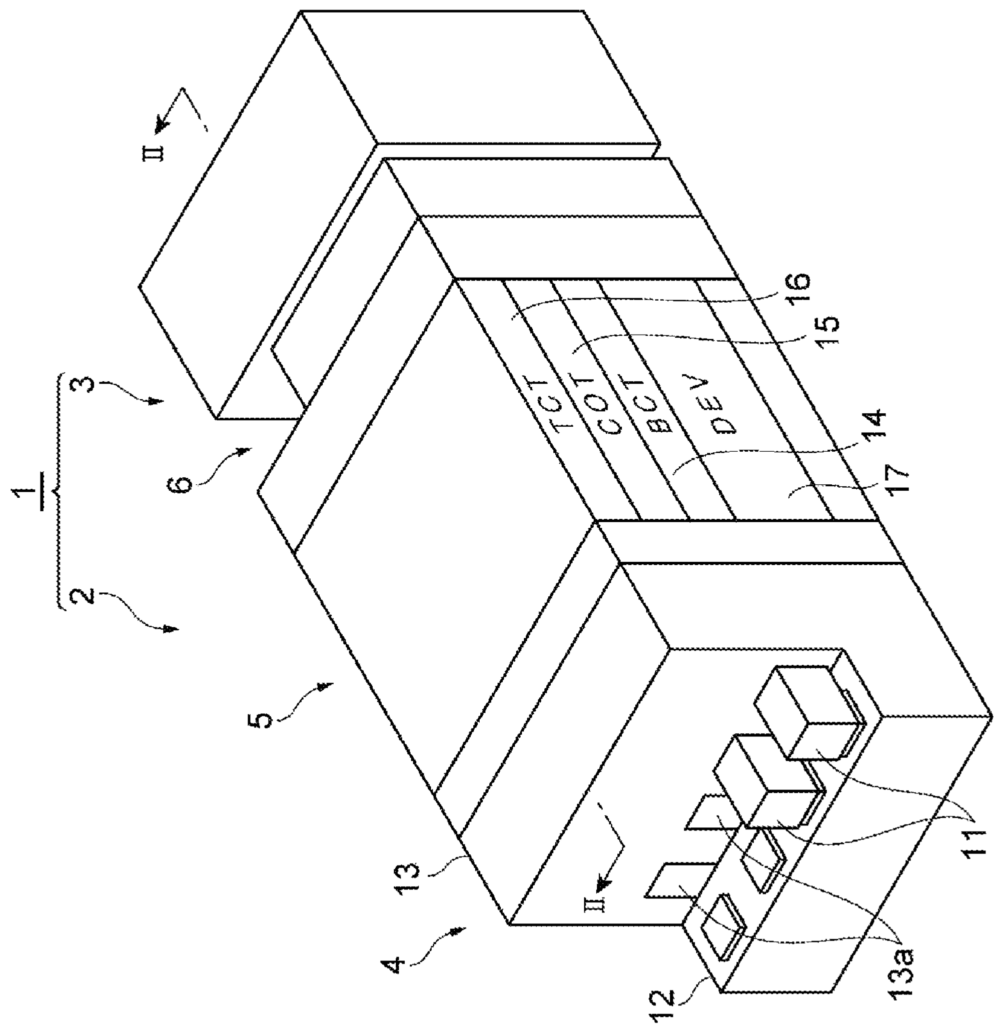
FIG. 1 is a perspective view of a substrate processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a substrate processing apparatus, a substrate processing method, and a storage medium which are effective for improving the uniformity of a film thickness of a coating film.

According to an aspect of the present disclosure, a substrate processing apparatus includes: a nozzle that ejects a processing liquid to a substrate; a force-feeding unit that force-feeds the processing liquid to the nozzle side; a liquid feeding pipeline that includes first and second valves arranged from the force-feeding unit side toward the nozzle side and guides the processing liquid from the force-feeding unit to the nozzle; and a controller, wherein the controller is configured to perform opening the first valve in a state where the second valve is closed and a pressure between the first and second valves is higher than a pressure between the force-feeding unit and the first valve, controlling the force-feeding unit to increase the pressure between the first and second valves that has been decreased by the opening of the first valve, and opening the second valve after the pressure between the first and second valves is decreased by the opening of the first valve.

According to the substrate processing apparatus, since the first valve is opened in the state where the pressure between the first and second valves is higher than the pressure between the force-feeding unit and the first valve, a backflow of the processing liquid from the first valve to the force-feeding unit side occurs so that the pressure between the first and second valves is decreased. When the force-feeding unit increases the pressure between the first and second valves, a sudden inflow of the processing liquid between the first and second valves is suppressed by the backflow of the processing liquid. Thus, a rapid increase of the pressure between the first and second valves is suppressed. As a result, when the second valve is opened, the overshoot of the ejection amount of the processing liquid is suppressed. Accordingly, since the ununiformity of the film thickness of the processing liquid that is caused by the overshoot may be suppressed, the uniformity of the film thickness is effectively improved.

The controller may be configured to further perform controlling the force-feeding unit to make the pressure between the force-feeding unit and the first valve lower than the pressure between the first and second valves, in a state where the first and second valves are closed. In this case, the controller may easily perform the opening the first valve in the state the pressure between the first and second valves is higher than the pressure between the force-feeding unit and the first valve, each time the ejection of the processing liquid from the nozzle is started.

The force-feeding unit may include a tank that accommodates the processing liquid, a pressurizing unit that pressurizes the processing liquid within the tank toward the nozzle side, and a third valve configured to release a pressure in the tank, and the controlling the force-feeding unit to make the pressure between the force-feeding unit and the first valve lower than the pressure between the first and second valves may include opening the third valve. In this case, by opening the third valve, the pressure between the force-feeding unit and the first valve may be quickly decreased. As a result, time required for the regulation of the pressure may be reduced, and thus, the throughput may be improved.

The controlling the force-feeding unit to make the pressure between the force-feeding unit and the first valve lower than the pressure between the first and second valves may include controlling the pressurizing unit to pressurize the processing liquid in the tank at a first pressure lower than the pressure between the first and second valves, and the controller may perform the opening the first valve in the state where the second valve is closed and the pressure between the first and second valves is higher than the pressure between the force-feeding unit and the first valve, in a state where the pressure between the force-feeding unit and the first valve becomes the first pressure. In this case, by stabilizing the pressure when opening the first valve, the reproducibility of the pressure transition of the processing liquid after the opening of the first valve until the opening of the second valve may be improved.

The controlling the force-feeding unit to increase the pressure between the first and second valves that has been decreased by the opening of the first valve may include controlling the pressurizing unit to make a pressure acting on the processing liquid after the opening of the second valve become higher than a pressure acting on the processing liquid before the opening of the second valve. In this case, by regulating the timing for increasing the pressure between the first and second valves with the pressurizing unit, the rapid increase of the pressure between the first and second valves may be more reliably suppressed.

The controller may be configured to further perform controlling the pressurizing unit to pressurize the processing liquid in the tank at a second pressure higher than the first pressure in a state where the first valve is opened and the second valve is closed, and closing the first valve in a state where the pressure between the first and second valves becomes the second pressure, and may perform the controlling the pressurizing unit to pressurize the processing liquid in the tank at the first pressure lower than the pressure between the first and second valves, in the state where the pressure between the first and second valves becomes the second pressure. In this case, by stabilizing the pressure when opening the first valve at both the portion between the force-feeding unit and the first valve and the portion between the first and second valves, the reproducibility of the pressure transition of the processing liquid after the opening of the first valve until the opening of the second valve may be further improved.

The controller may be configured to further perform controlling the pressurizing unit to pressurize the processing liquid in the tank at a third pressure in a state where the first and second valves are opened, and the second pressure may be lower than the third pressure. In this case, by suppressing the sudden fluctuation of the pressure when opening the first valve, the reproducibility of the pressure transition of the processing liquid after the opening of the first valve until the opening of the second valve may be further improved.

The force-feeding unit may further include a fourth valve configured to cut off the pressure by the pressurizing unit, and the opening the third valve may include switching a state where the third valve is closed and the fourth valve is opened, to a state where the fourth valve is closed and the third valve is opened. In this case, by releasing the pressure in the tank in the state where the pressurization in the tank by the pressurizing unit is cut off, the pressure between the force-feeding unit and the first valve may be more quickly decreased.

The force-feeding unit may include a plurality of force-feeding systems each having the tank and the third and fourth valves, the liquid feeding pipeline may include a plurality of first valves corresponding to the plurality of force-feeding systems, respectively, and the controller may be configured to further perform switching a force-feeding system that supplies the processing liquid to the nozzle, among the plurality of force-feeding systems, by the first and fourth valves. In this case, by using the first and fourth valves for both the switching a force-feeding system in an active state and the regulation of the pressure at the time of starting the ejection of the processing liquid, simplification of the apparatus configuration may be implemented.

The substrate processing apparatus may further include a rotation holding mechanism that holds and rotates the substrate, and a nozzle moving mechanism that moves the nozzle, and the controller may be configured to further perform controlling the rotation holding mechanism and the nozzle moving mechanism to cause the processing liquid ejected from the nozzle to be spirally coated on the substrate, by moving the nozzle while rotating the substrate. In this case, the formation of the liquid film is implemented by the method of spirally coating the processing liquid on the substrate (hereinafter, referred to as the "spiral coating method"). In the spiral coating method, the ununiformity of the supply amount of the processing liquid easily affects the uniformity of the film thickness, as compared with the case where the liquid film is formed by the method of causing the processing liquid supplied to the rotation center of the substrate to spread toward the outer peripheral side of the substrate by the centrifugal force. Thus, when the controller performs the control of the spiral coating method, it is more beneficial to suppress the overshoot of the ejection amount of the processing liquid.

The controlling the rotation holding mechanism and the nozzle moving mechanism to cause the processing liquid ejected from the nozzle to be spirally coated may include controlling the nozzle moving mechanism to move the nozzle starting ejection of the processing liquid from a rotation center to an outer peripheral side of the substrate.

When the nozzle is moved from the rotation center side to the outer peripheral side of the substrate, the processing liquid at the time of starting the ejection from the nozzle is coated on the rotation center of the substrate. Thus, it is more beneficial to suppress the overshoot of the ejection amount of the processing liquid.

When the processing liquid is coated by the spiral coating method, the movement speed of the nozzle based on the substrate is required to be kept constant, in order to improve the uniformity of the film thickness. To this end, it is necessary to increase the rotation speed of the substrate when supplying the processing liquid to the outer peripheral side of the substrate, as compared with that when supplying the processing liquid to the rotation center of the substrate. Premising this control, when the nozzle is moved from the outer peripheral side toward the rotation center side of the substrate in order to spirally coat the processing liquid, the centrifugal force acting on the processing liquid supplied to the outer peripheral side of the substrate is increased as the nozzle approaches the rotation center of the substrate. Thus, a flow of the already coated processing liquid may easily occur. Meanwhile, when the nozzle is moved from the rotation center side toward the outer peripheral side of the substrate, the centrifugal force acting on the processing liquid supplied to the rotation center side of the substrate is decreased as the nozzle is moved to the outer peripheral side of the substrate. Thus, the flow of the already coated processing liquid hardly occurs. In view of this point as well, moving the nozzle from the rotation center side toward the outer peripheral side of the substrate is effective for improving the uniformity of the film thickness.

The substrate processing apparatus may further include a liquid contact detecting mechanism that detects an arrival of the processing liquid ejected from the nozzle at the substrate, and the controlling the rotation holding mechanism and the nozzle moving mechanism to cause the processing liquid ejected from the nozzle to be spirally coated may include controlling the nozzle moving mechanism to start the movement of the nozzle after the arrival of the processing liquid is detected by the liquid contact detecting mechanism. In this case, it is possible to suppress the occurrence of the ununiformity of the film thickness near the rotation center of the substrate that is caused when the nozzle is moved before the processing liquid arrives at the substrate or when the movement of the nozzle is delayed after the processing liquid arrives at the substrate. Thus, the uniformity of the film thickness may be further improved.

The force-feeding unit may be configured to force-feed the processing liquid having a viscosity of 500 cP to 7,000 cP. When the processing liquid having the viscosity of 500 cP to 7,000 cP is used, a response delay may easily occur in the control of the ejection amount of the processing liquid from the nozzle, as compared with the case where the processing liquid having a viscosity lower than the viscosity of 500 cP to 7,000 cP is used, and therefore, the ejection amount may become unstable. Thus, it is more beneficial to suppress the overshoot of the ejection amount of the processing liquid.

According to another aspect of the present disclosure, a substrate processing method uses a substrate processing apparatus including a nozzle that ejects a processing liquid to a substrate, a force-feeding unit that force-feeds the processing liquid to the nozzle side, a liquid feeding pipeline that includes first and second valves arranged from the force-feeding unit side toward the nozzle side and guides the processing liquid from the force-feeding unit to the nozzle, and a controller, and may include opening the first valve in a state where the second valve is closed and a pressure between the first and second valves is higher than a pressure between the force-feeding unit and the first valve, controlling the force-feeding unit to increase the pressure between the first and second valves that has been decreased by the opening of the first valve, and opening the second valve after the pressure between the first and second valves is decreased by the opening of the first valve.

The substrate processing method may further include controlling the force-feeding unit to make the pressure between the force-feeding unit and the first valve lower than the pressure between the first and second valves, in a state where the first and second valves are closed.

The force-feeding unit includes a tank that accommodates the processing liquid, a pressurizing unit that pressurizes the processing liquid in the tank toward the nozzle side, and a third valve configured to release a pressure in the tank, and the controlling the force-feeding unit to make the pressure between the force-feeding unit and the first valve lower than the pressure between the first and second valves may include opening the third valve.

The controlling the force-feeding unit to make the pressure between the force-feeding unit and the first valve lower than the pressure between the first and second valves may include controlling the pressurizing unit to pressurize the processing liquid in the tank at a first pressure lower than the pressure between the first and second valves, and the opening the first valve in the state where the second valve is closed and the pressure between the first and second valves is higher than the pressure between the force-feeding unit and the first valve may be performed in a state where the pressure between the force-feeding unit and the first valve becomes the first pressure.

The controlling the force-feeding unit to increase the pressure between the first and second valves that has been decreased by the opening of the first valve may include controlling the pressurizing unit to make a pressure acting on the processing liquid after the opening of the second valve become higher than a pressure acting on the processing liquid before the opening of the second valve.

The substrate processing method may further include controlling the pressurizing unit to pressurize the processing liquid in the tank at a second pressure higher than the first pressure in a state where the first valve is opened and the second valve is closed, and closing the first valve in a state where the pressure between the first and second valves becomes the second pressure, and the controlling the pressurizing unit to pressurize the processing liquid in the tank at the first pressure lower than the pressure between the first and second valves may be performed in the state where the pressure between the first and second valves becomes the second pressure.

The substrate processing method may further include controlling the pressurizing unit to pressurize the processing liquid in the tank at a third pressure, in a state where the first and second valves are opened, and the second pressure may be lower than the third pressure.

The processing liquid having a viscosity of 500 cP to 7,000 cP may be used.

According to still another aspect of the present disclosure, a storage medium is a non-transitory computer-readable storage medium storing a program that, when executed, cause an apparatus to perform the above-described substrate processing method.

According to the present disclosure, it is possible to provide a substrate processing apparatus, a substrate processing method, and a storage medium which are effective for improving the uniformity of the film thickness of a coating film.

Hereinafter, exemplary embodiments will be described in detail with reference to the accompanying drawings. In the descriptions, similar components or components having similar functions will be denoted by common reference numerals, and overlapping descriptions will be omitted.

[Substrate Processing System]

A substrate processing system 1 performs formation, exposure, and development of a photosensitive film on a substrate. The substrate to be processed is, for example, a semiconductor wafer W. The photosensitive film is, for example, a resist film.

The substrate processing system 1 includes a coating/developing apparatus 2 and an exposing apparatus 3. The exposing apparatus 3 performs a process of exposing a resist film formed on a wafer W. Specifically, the exposing apparatus 3 irradiates an energy beam to an exposure target portion of the resist film according to, for example, a liquid-immersion exposure method. The coating/developing apparatus 2 performs a process of forming the resist film on the front surface of the wafer W before the exposing process by the exposing apparatus 3, and a process of developing the resist film after the exposing process.

(Coating/Developing Apparatus)

Figure 2:
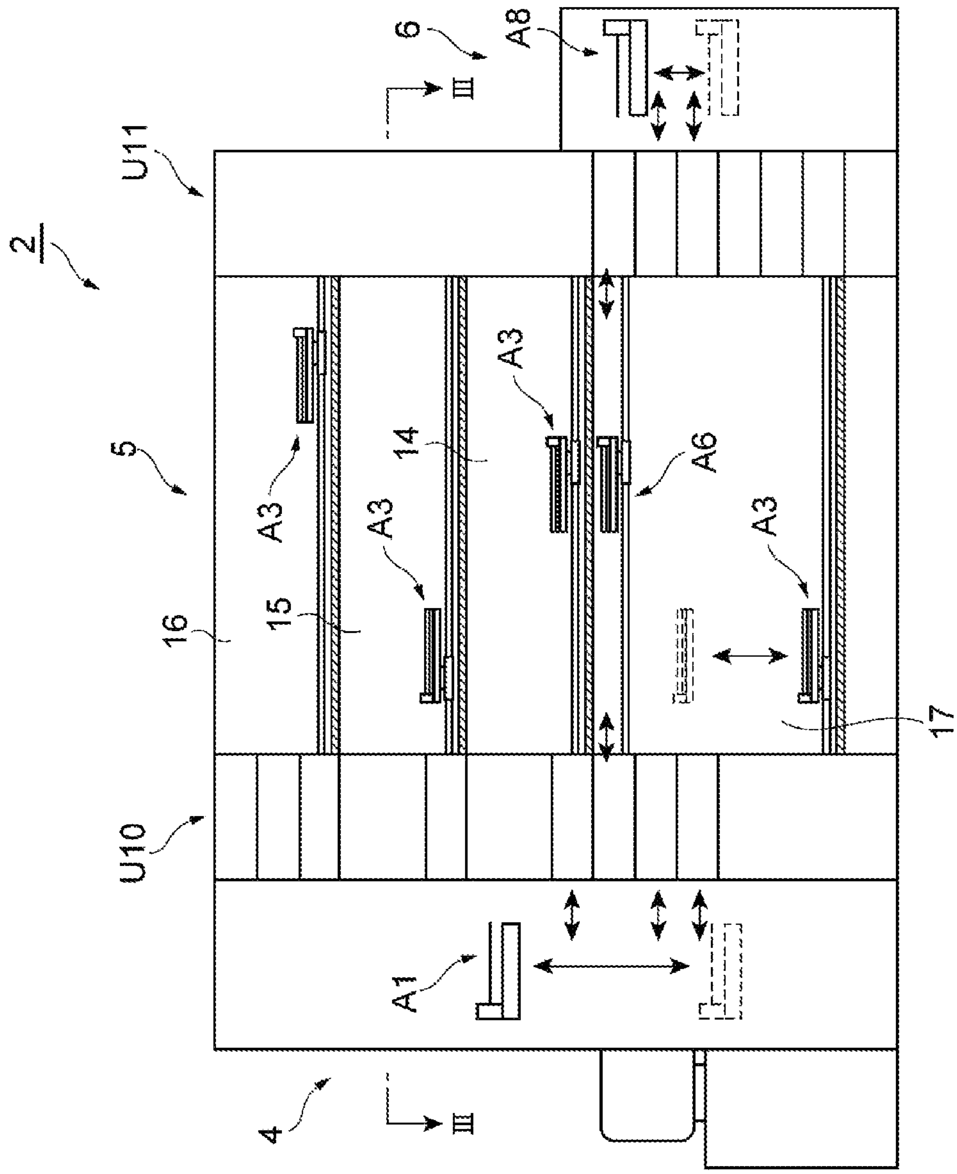
FIG. 2 is a cross-sectional view taken along line II-II in FIG. 1.
Figure 3:
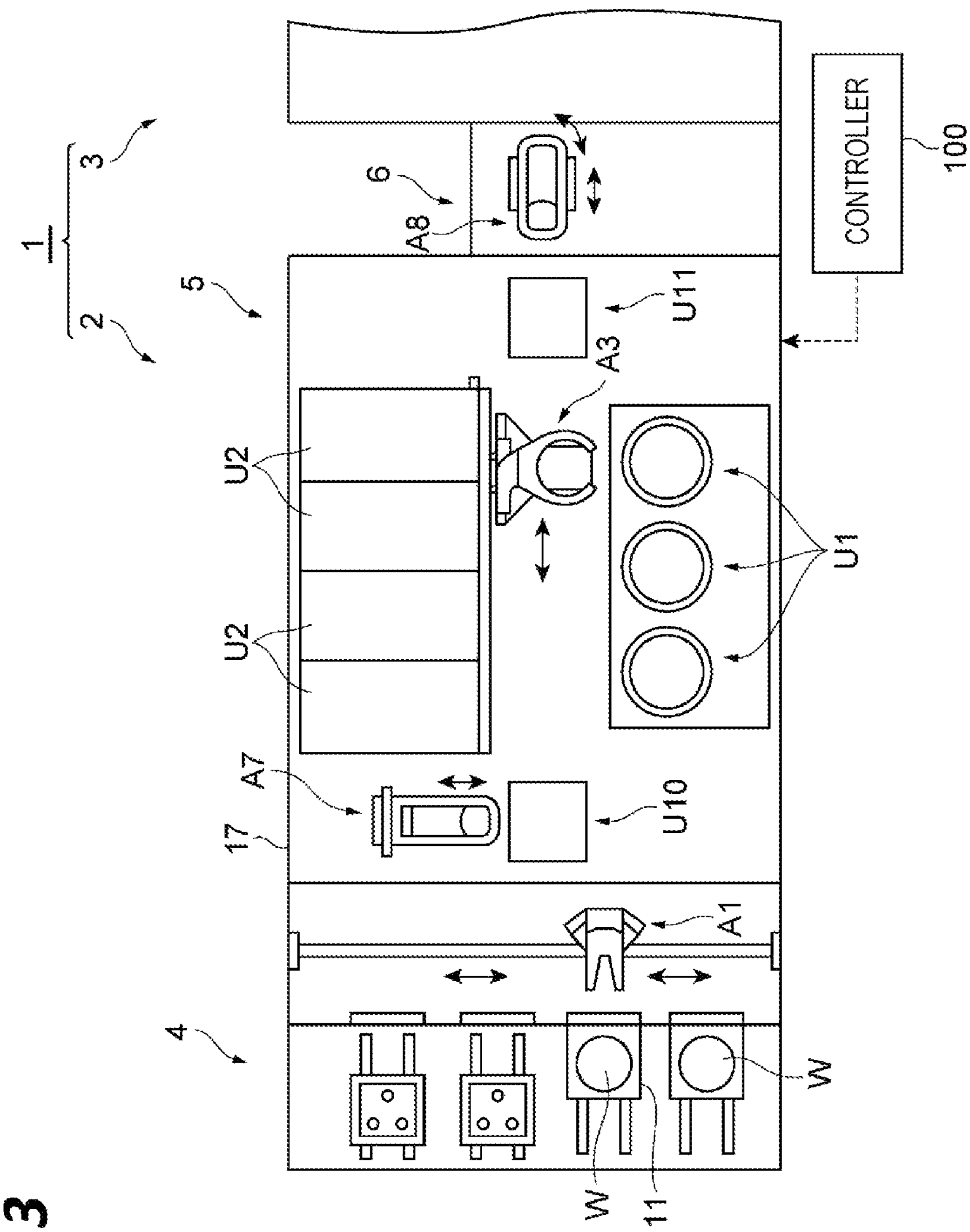
FIG. 3 is a cross-sectional view taken along line III-III in FIG. 2.

Hereinafter, the configuration of the coating/developing apparatus 2 as an example of the substrate processing apparatus will be described. As illustrated in FIGS. 1 to 3, the coating/developing apparatus 2 includes a carrier block 4, a processing block 5, an interface block 66, and a controller 100.

The carrier block 4 performs carrying a wafer W into the coating/developing apparatus 2 and carrying the wafer W out of the coating/developing apparatus 2. For example, the carrier block 4 may support a plurality of carriers 11 for wafers W and has a conveyance arm A1 therein. Each carrier 11 accommodates a plurality of, for example, circular wafers W. The conveyance arm A1 takes out a wafer W from the carrier 11 to convey the wafer W to the processing block 5, and receives the wafer W from the processing block 5 to return the wafer W into the carrier 11.

The processing block 5 includes a plurality of processing modules 14, 15, 16, and 17. As illustrated in FIGS. 2 and 3, each of the processing modules 14, 15, 16, and 17 includes a plurality of liquid processing units U1, a plurality of heat treatment units U2, and a conveyance arm A3 that conveys a wafer W to the units. The processing module 17 further includes a direct conveyance arm A6 that directly conveys a wafer W without passing the liquid processing units U1 and the heat treatment units U2. The liquid processing units U1 coat a processing liquid on the front surface of a wafer W. The heat treatment units U2 each includes, for example, a heating plate and a cooling plate, and performs a heat treatment by heating a wafer W with the heating plate and cooling the heated wafer W with the cooling plate.

The processing module 14 forms a lower layer film on the front surface of a wafer W by the liquid processing units U1 and the heat treatment units U2. The liquid processing units U1 of the processing module 14 coat a processing liquid for forming the lower layer film on the wafer W. The heat treatment units U2 of the processing module 14 perform various heat treatments accompanied by the formation of the lower layer film.

The processing module 15 forms a resist film on the lower layer film by the liquid processing units U1 and the heat treatment units U2. The liquid processing units U1 of the processing module 15 coat a processing liquid for forming the resist film on the lower layer film. The heat treatment units U2 of the processing module 15 perform various heat treatments accompanied by the formation of the resist film.

The processing module 16 forms an upper layer film on the resist film by the liquid processing units U1 and the heat treatment units U2. The liquid processing units U1 of the processing module 16 coat a processing liquid for forming the upper layer film on the resist film. The heat treatment units U2 of the processing module 16 perform various heat treatments accompanied by the formation of the upper layer film.

The processing module 17 performs a process of developing the exposed resist film by the liquid processing units U1 and the heat treatment units U2. The liquid processing units U1 of the processing module 17 perform the process of developing the resist film by coating a developer on the front surface of the exposed wafer W, and then, cleansing the wafer W with a rinse liquid. The heat treatment units U2 of the processing module 17 perform various heat treatments accompanied by the developing process. Specific examples of the heat treatments may be a heating before the developing process (post exposure bake (PEB)), a heating after the developing process (post bake (PB)) and others.

A shelf unit U10 is provided on the carrier block 4 side within the processing block 5. The shelf unit U10 is partitioned into a plurality of vertically arranged cells. A lift arm A7 is provided in the vicinity of the shelf unit U10. The lift arm A7 moves the wafer W up and down between the cells of the shelf unit U10. A shelf unit U11 is provided on the carrier block 6 side within the processing block 5. The shelf unit U11 is partitioned into a plurality of vertically arranged cells.

The interface block 6 performs the conveyance of the wafer W between the processing block 5 and the exposing apparatus 3. For example, the interface block 6 includes a conveyance arm A8 and is connected to the exposing apparatus 3. The conveyance arm A8 conveys the wafer W placed on the shelf unit U11 to the exposing apparatus 3, and receives the wafer W from the exposing apparatus 3 to return the wafer W to the shelf unit U11.

The controller 100 controls the coating/developing apparatus 2 to perform the coating/developing process, for example, according to the following procedures.

First, the controller 100 controls the conveyance arm Al to convey the wafer W inside the carrier 11 to the shelf unit U10, and controls the lift arm A7 to place the wafer W in the cell for the processing module 14.

Next, the controller 100 controls the conveyance arm A3 to convey the wafer W of the shelf unit U10 to the liquid processing units U1 and the heat treatment units U2 within the processing module 14, and controls the liquid processing units U1 and the heat treatment units U2 to form the lower layer film on the front surface of the wafer W. Then, the controller 100 controls the conveyance arm A3 to return the wafer W formed with the lower layer film thereon to the shelf unit U10, and controls the lift arm A7 to place the wafer W in the cell for the processing module 15.

Next, the controller 100 controls the conveyance arm A3 to convey the wafer W of the shelf unit U10 to the liquid processing units U1 and the heat treatment units U2 within the processing module 15, and controls the liquid processing units U1 and the heat treatment units U2 to form the resist film on the lower layer film of the wafer W. Then, the controller 100 controls the conveyance arm A3 to return the wafer W to the shelf unit U10, and controls the lift arm A7 to place the wafer W in the cell for the processing module 16.

Next, the controller 100 controls the conveyance arm A3 to convey the wafer W of the shelf unit U10 to the liquid processing units U1 and the heat treatment units U2 within the processing module 16, and controls the liquid processing units U1 and the heat treatment units U2 to form the upper layer film on the resist film of the wafer W. Then, the controller 100 controls the conveyance arm A3 to return the wafer W to the shelf unit U10, and controls the lift arm A7 to place the wafer W in the cell for the processing module 17.

Next, the controller 100 controls the direct conveyance arm A6 to convey the wafer W of the shelf unit U10 to the shelf unit U11, and controls the conveyance arm A8 to send out the wafer W to the exposing apparatus 3. Then, the controller 100 controls the conveyance arm A8 to receive the exposed wafer W from the exposing apparatus 3 and return the wafer W to the shelf unit U11.

Next, the controller 100 controls the conveyance arm A3 to convey the wafer W of the shelf unit U11 to the liquid processing units U1 and the heat treatment units U2 within the processing module 17, and controls the liquid processing units U1 and the heat treatment units U2 to perform the developing process on the resist film of the wafer W. Then, the controller 100 controls the conveyance arm A3 to return the wafer W to the shelf unit U10, and controls the lift arm A7 and the conveyance arm Al to return the wafer W into the carrier 11. Accordingly, the coating/developing process is completed.

In addition, the specific configuration of the substrate processing apparatus is not limited to the configuration of the coating/developing apparatus 2 as exemplified above. Any substrate processing apparatus may be used as long as the substrate processing apparatus includes the liquid processing units U1 for the film formation (the liquid processing units U1 of the processing modules 14, 15, and 16) and the controller 100 capable of controlling the liquid processing units U1.

(Coating Unit)

Figure 4:
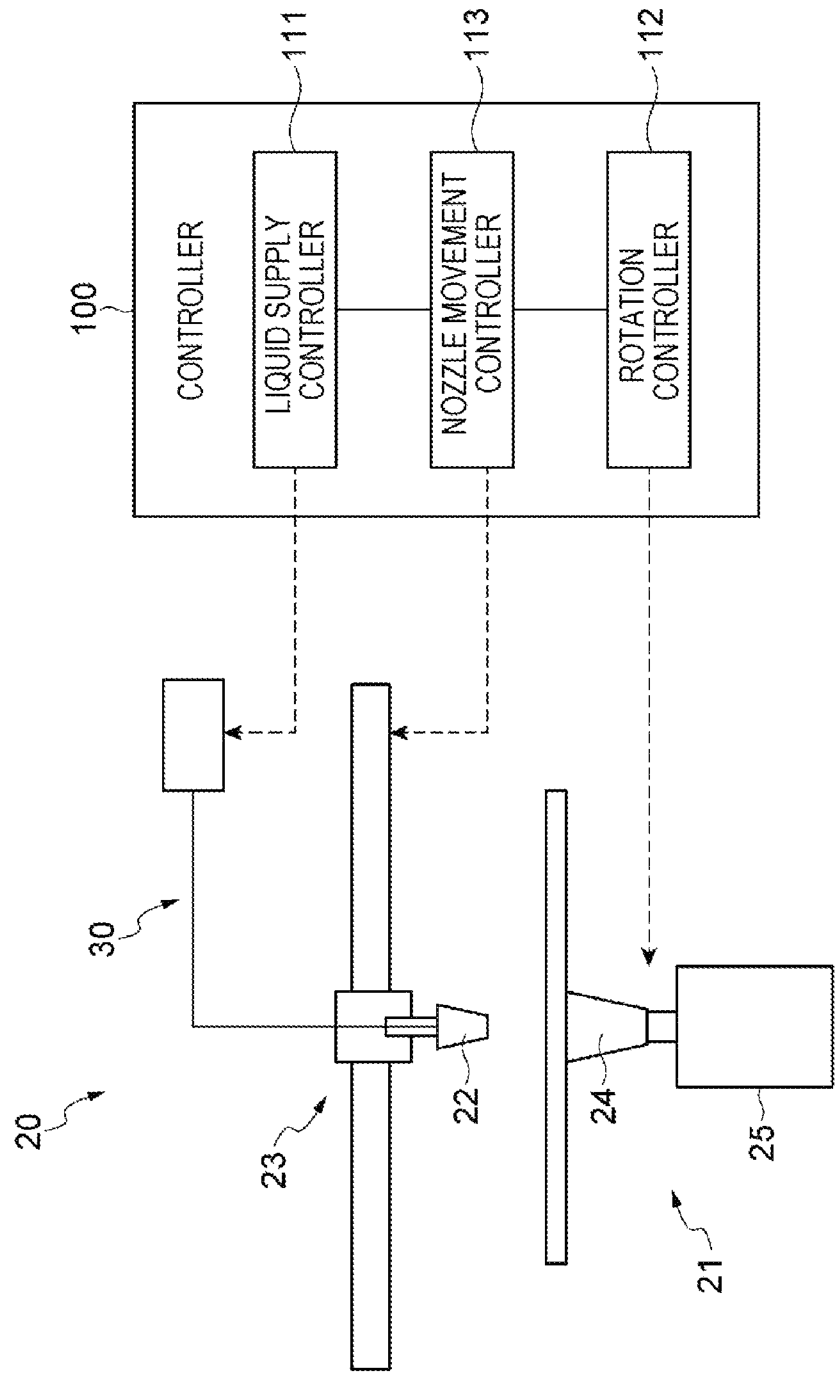
FIG. 4 is a schematic view of a coating unit.

Subsequently, the liquid processing units U1 of the processing module 15 will be described in detail. Each liquid processing unit U1 of the processing module 15 includes a coating unit 20. As illustrated in FIG. 4, the coating unit 20 includes a rotation holding mechanism 21, a nozzle 22, a nozzle moving mechanism 23, and a processing liquid supply unit 30.

The rotation holding mechanism 21 holds and rotates a semiconductor wafer W as an example of the substrate. The rotation holding mechanism 21 includes, for example, a holding unit 24 and a rotation driving unit 25. The holding unit 24 supports the center of the wafer W disposed horizontally with the front surface Wa thereof facing upward, and holds the wafer W by, for example, vacuum adsorption.

The rotation driving unit 25 is, for example, an actuator using an electric motor or the like as a power source, and rotates the holding unit 24 around the vertical rotation center RC. As a result, the wafer W is rotated around the rotation center RC.

The nozzle 22 ejects the processing liquid to the wafer W. The processing liquid is, for example, a resist liquid containing a photosensitive resist agent. The nozzle 22 is disposed above the wafer W and ejects the processing liquid downward.

The nozzle moving mechanism 23 moves the nozzle 22. For example, the nozzle moving mechanism 23 moves the nozzle 22 along a horizontal straight line passing through the rotation center RC, by using an electric motor or the like as a power source.

Figure 5:
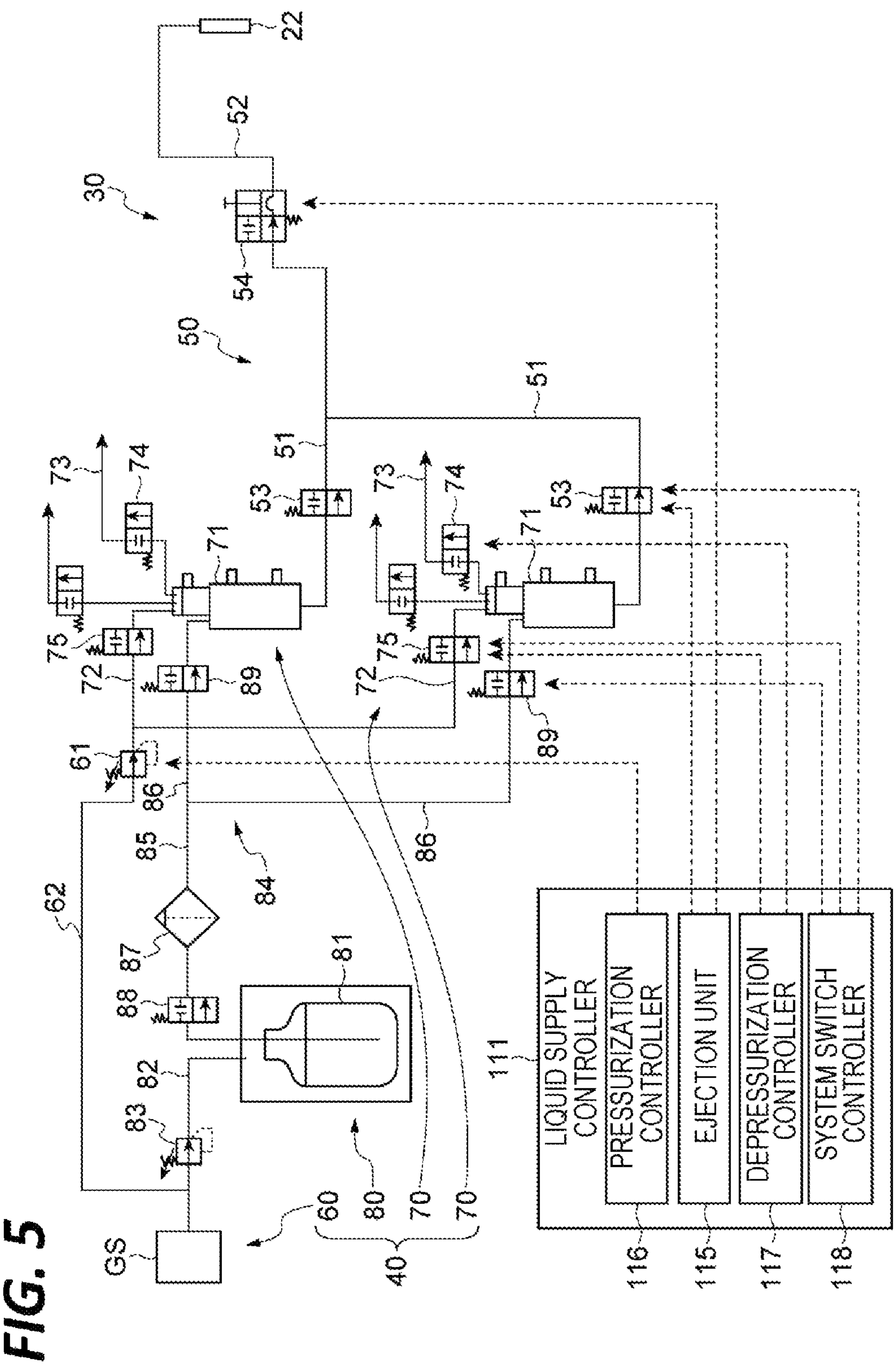
FIG. 5 is a schematic view of a processing liquid supply unit.

The processing liquid supply unit 30 supplies the processing liquid to the nozzle 22. As illustrated in FIG. 5, the processing liquid supply unit 30 includes a force-feeding unit 40 and a liquid feeding pipeline 50. The force-feeding unit 40 force-feeds the processing liquid to the nozzle 22 side. As an example, the force-feeding unit 40 includes a pressurizing unit 60, a plurality of force-feeding systems 70, and a liquid replenishing unit 80.

The pressurizing unit 60 pressurizes the processing liquid in a tank 71 (to be described later) to the nozzle 22 side. For example, the pressurizing unit 60 has a pressure regulating valve 61 connected to a pressurization source GS via a pressurization pipe 62. The pressurization source GS discharges inert gas (e.g., nitrogen gas) for pressurization. The pressure regulating valve 61 is, for example, an electronic valve and regulates the pressure in the tank 71 by regulating the flow rate of the inert gas flowing into the tank 71 (to be described later) from the pressurization source GS.

Each of the plurality of force-feeding systems 70 includes the tank 71 and valves 74 and 75. The tank 71 accommodates the processing liquid. In addition, the viscosity of the processing liquid accommodated in the tank 71 may be, for example, 500 cP to 7,000 cP. That is, the force-feeding unit 40 may be configured to force-feed the processing liquid having the viscosity of 500 cP to 7,000 cP. The top portion of the tank 71 is connected to the pressure regulating valve 61 via a pressurization pipe 72. Thus, the interior of the tank 71 may be pressurized by using the pressurizing unit 60. Further, the top portion of the tank 71 is connected to a degassing pipe 73. The end of the degassing pipe 73 is opened to the outside of the tank 71.

The valve 74 (a third valve) is provided in the degassing pipe 73. The valve 74 is, for example, an air operation valve and opens/closes the flow path inside the degassing pipe 73. By opening the valve 74, the pressure in the tank 71 may be released to the outside of the tank 71.

The valve 75 (a fourth valve) is provided in the pressurization pipe 72. The valve 75 is, for example, an air operation valve and opens/closes the flow path inside the pressurization pipe 72. By closing the valve 75, the pressure by the pressurizing unit 60 may be cut off.

The liquid replenishing unit 80 replenishes the processing liquid in the tank 71. The liquid replenishing unit 80 includes a tank 81, a pressure regulating valve 83, a filter 87, a valve 88, and a plurality of valves 89. The tank 81 accommodates a processing liquid for the replenishment. The top portion of the tank 81 is connected to the pressurization source GS via a pressurization pipe 82. The processing liquid in the tank 81 is force-fed to the tank 71 through a replenishment pipe 84 by the pressure from the pressurization source GS. The replenishment pipe 84 includes a first portion 85 that extends from the vicinity of the bottom portion of the tank 81 to the outside of the tank 81, and a plurality of second portions 86 that are branched from the first portion 85 and connected to the tanks 71 of the plurality of force-feeding systems 70, respectively.

The pressure regulating valve 83 is provided in the pressurization pipe 82 and regulates the pressure in the tank 81. The pressure regulating valve 83 is, for example, an electronic valve and regulates the pressure in the tank 81 by regulating the flow rate of the inert gas flowing into the tank 81 from the pressurization source GS.

The filter 87 is provided in the first portion 85 of the replenishment pipe 84, and collects dust in the processing liquid.

The valve 88 is provided between the tank 81 and the filter 87 in the first portion 85. The valve 88 is, for example, an air operation valve and opens/closes the flow path inside the first portion 85. By closing the valve 88, the discharge of the processing liquid from the tank 81 may be cut off.

The plurality of valves 89 are provided in the plurality of second portions 86 of the replenishment pipe 84, respectively. Each valve 89 is, for example, an air operation valve and opens/closes the flow path inside each of the second portions 86. By closing the valve 89, the flow of the processing liquid into the tank 71 may be cut off.

The liquid feeding pipeline 50 includes valves 53 and 54 arranged from the force-feeding unit 40 side toward the nozzle 22 side, and guides the processing liquid from the force-feeding unit 40 to the nozzle 22. For example, the liquid feeding pipeline 50 includes a plurality of liquid feeding pipes 51, a liquid feeding pipe 52, a plurality of valves 53, and a valve 54.

The plurality of liquid feeding pipes 51 guide the processing liquid from the tanks 71 of the plurality of force-feeding systems 70, respectively. Each of the plurality of liquid feeding pipes 51 extends from the vicinity of the bottom portion of the tank 71 to the outside of the tank 71. The plurality of liquid feeding pipes 51 are merged with each other at the nozzle 22 side. The liquid feeding pipe 52 guides the processing liquid from the merged portion of the plurality of liquid feeding pipes 51 to the nozzle 22.

The plurality of valves 53 (first valves) are provided in the plurality of liquid feeding pipes 51, respectively. That is, the plurality of valves 53 are provided to correspond to the plurality of force-feeding systems 70, respectively. Each valve 53 is, for example, an air operation valve and opens/closes the flow path inside each of the liquid feeding pipes 51. The valve 54 (a second valve) is provided in the liquid feeding pipe 52. The valve 54 is, for example, an air operation valve and opens/closes the flow path inside the liquid feeding pipe 52.

Figure 6A:
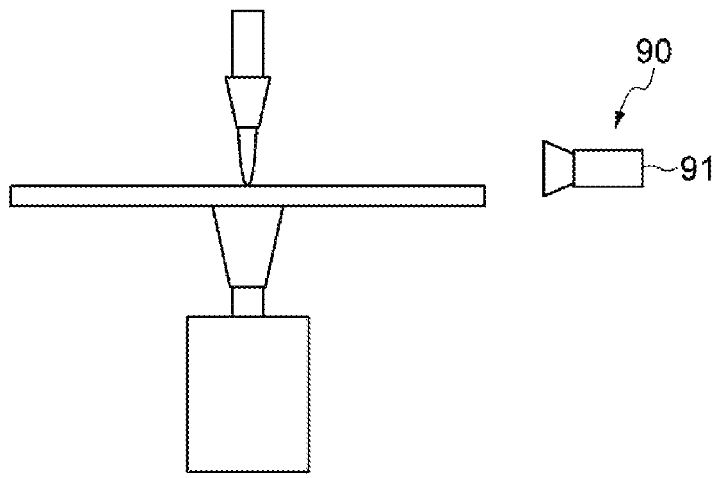
FIGS. 6A and 6B are schematic views of a liquid contact detecting mechanism.
Figure 6B:
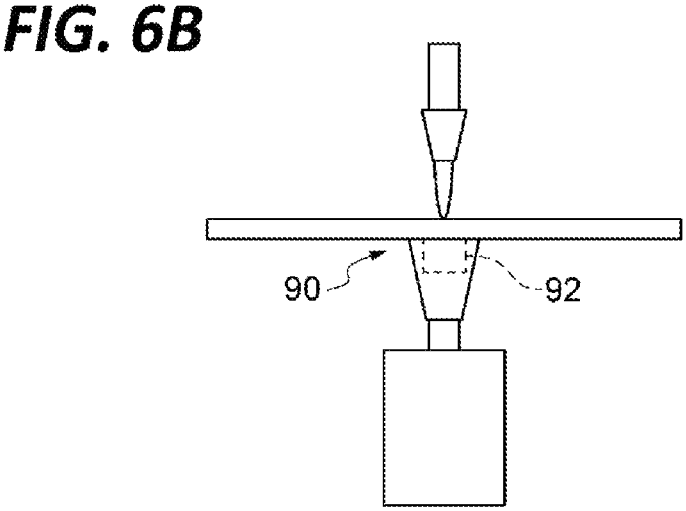

As illustrated in FIGS. 6A and 6B, the coating unit 20 may further include a liquid contact detecting mechanism 90. The liquid contact detecting mechanism 90 detects the arrival of the processing liquid ejected from the nozzle 22 at the wafer W. As a specific example of the liquid contact detecting mechanism 90, as illustrated in FIG. 6A, a camera 91 may be provided to capture the front surface Wa, and the arrival of the processing liquid may be detected based on an image acquired by the camera 91. Alternatively, as illustrated in FIG. 6B, a temperature sensor 92 may be provided to detect a temperature of the rear surface of the wafer W, and the arrival of the processing liquid may be detected based on a decrease of the temperature of the wafer W.

(Controller)

The coating unit 20 is controlled by the above-described controller 100. Hereinafter, the configuration of the controller 100 for controlling the coating unit 20 will be described. The controller 100 is configured to perform opening the valves 53 in a state where the valve 54 is closed and the pressure between the valves 53 and 54 is higher than the pressure between the force-feeding unit 40 and the valve 53, controlling the force-feeding unit 40 to increase the pressure between the valves 53 and 54 that has been decreased by the opening of the valve 53, and opening the valve 54 after the pressure between the valves 53 and 54 is decreased by the opening of the valve 53.

The controller 100 may be configured to further perform controlling the force-feeding unit 40 to make the pressure between the force-feeding unit 40 and the valves 53 lower than the pressure between the valves 53 and 54, in a state where the valves 53 and 54 are closed, switching a force-feeding system 70 that supplies the processing liquid to the nozzle 22, among the plurality of force-feeding systems 70, by the valves 53 and 75, and controlling the rotation holding mechanism 21 and the nozzle moving mechanism 23 to cause the processing liquid ejected from the nozzle 22 to be spirally coated on the wafer W by moving the nozzle 22 while rotating the wafer W.

As exemplified in FIG. 4, the controller 100 includes a liquid supply controller 111, a rotation controller 112, and a nozzle movement controller 113 as functional modules.

The liquid supply controller 111 controls the processing liquid supply unit 30 to supply the processing liquid to the nozzle 22. As exemplified in FIG. 5, the liquid supply controller 111 includes an ejection controller 115, a pressurization controller 116, a depressurization controller 117, and a system switch controller118 as functional modules.

The ejection controller 115 opens and closes the valves 53 and 54 to switch the ejection state of the processing liquid from the nozzle 22. For example, the ejection controller 115 may perform opening the valve 53 in the state where the valve 54 is closed and the pressure between the valves 53 and 54 is higher than the pressure between the force-feeding unit 40 and the valve 53, and opening the valve 54 after the pressure between the valves 53 and 54 is decreased by the opening of the valve 53.

The pressurization controller 116 controls the force-feeding unit 40 to regulate the pressurization state inside the tank 71. For example, the pressurization controller 116 controls the force-feeding unit 40 to make the pressure between the force-feeding unit 40 and the valve 53 lower than the pressure between the valves 53 and 54. More specifically, the pressurization controller 116 controls the pressurizing unit 60 to pressurize the processing liquid in the tank 71 at a pressure lower than the pressure between the valves 53 and 54. Further, the pressurization controller 116 controls the force-feeding unit 40 to increase the pressure between the valves 53 and 54 that has been decreased by the opening of the valve 53. More specifically, the pressurization controller 116 controls the pressurizing unit 60 to make the pressure acting on the processing liquid after the opening of the valve 54 become higher than the pressure acting on the processing liquid before the opening of the valve 54.

The depressurization controller 117 opens and closes the valves 74 and 75 to make the pressure between the force-feeding unit 40 and the valve 53 lower than the pressure between the valves 53 and 54. For example, the pressurization controller 117 opens the valve 74 to decrease the pressure in the tank 71. More specifically, the depressurization controller 117 decreases the pressure in the tank 71 by switching the state where the valve 74 is closed and the valve 75 is opened, to the state where the valve 75 is closed and the valve 74 is opened.

The system switch controller 118 switches a force-feeding system 70 that supplies the processing liquid to the nozzle 22, among the plurality of the force-feeding systems 70, by the valves 53 and 75. For example, the system switch controller 118 switches the state of each of the force-feeding systems 70 to the state of being able to supply the processing liquid to the nozzle 22 (hereinafter, referred to as the "active state") or the state of being unable to supply the processing liquid to the nozzle 22 (hereinafter, referred to as the "inactive state"). When one of the force-feeding systems 70 is brought into the inactive state, the system switch controller 118 closes the valve 75 of the force-feeding system 70 and the valve 53 corresponding to the force-feeding system 70 so as to preclude the valves 75 and 53 from being opened/closed until the force-feeding system 70 is brought into the active state again. When the force-feeding system 70 is brought into the active state, the system switch controller 118 makes the valve 75 of the force-feeding system 70 openable/closable and makes the valve 53 corresponding to the force-feeding system 70 openable/closable, in order to supply the processing liquid to the nozzle 22. Further, the system switch controller 118 controls the liquid replenishing unit 80 to replenish the processing liquid in the tank 71 of the force-feeding system 70 brought into the inactive state.

Referring back to FIG. 4, the rotation controller 112 controls the rotation holding mechanism 21 to rotate the wafer W.

The nozzle movement controller 113 controls the nozzle moving mechanism 23 to move the nozzle 22 that is ejecting the processing liquid. For example, the nozzle movement controller 113 controls the nozzle moving mechanism 23 to move the nozzle 22 starting the ejection of the processing liquid from the rotation center RC to the outer peripheral side of the wafer W. When the coating unit 20 includes the above-described liquid contact detecting mechanism 90, the nozzle movement controller 113 may control the nozzle moving mechanism 23 to start the movement of the nozzle 22 after the arrival of the processing liquid is detected by the liquid contact detecting mechanism 90.

Figure 7:
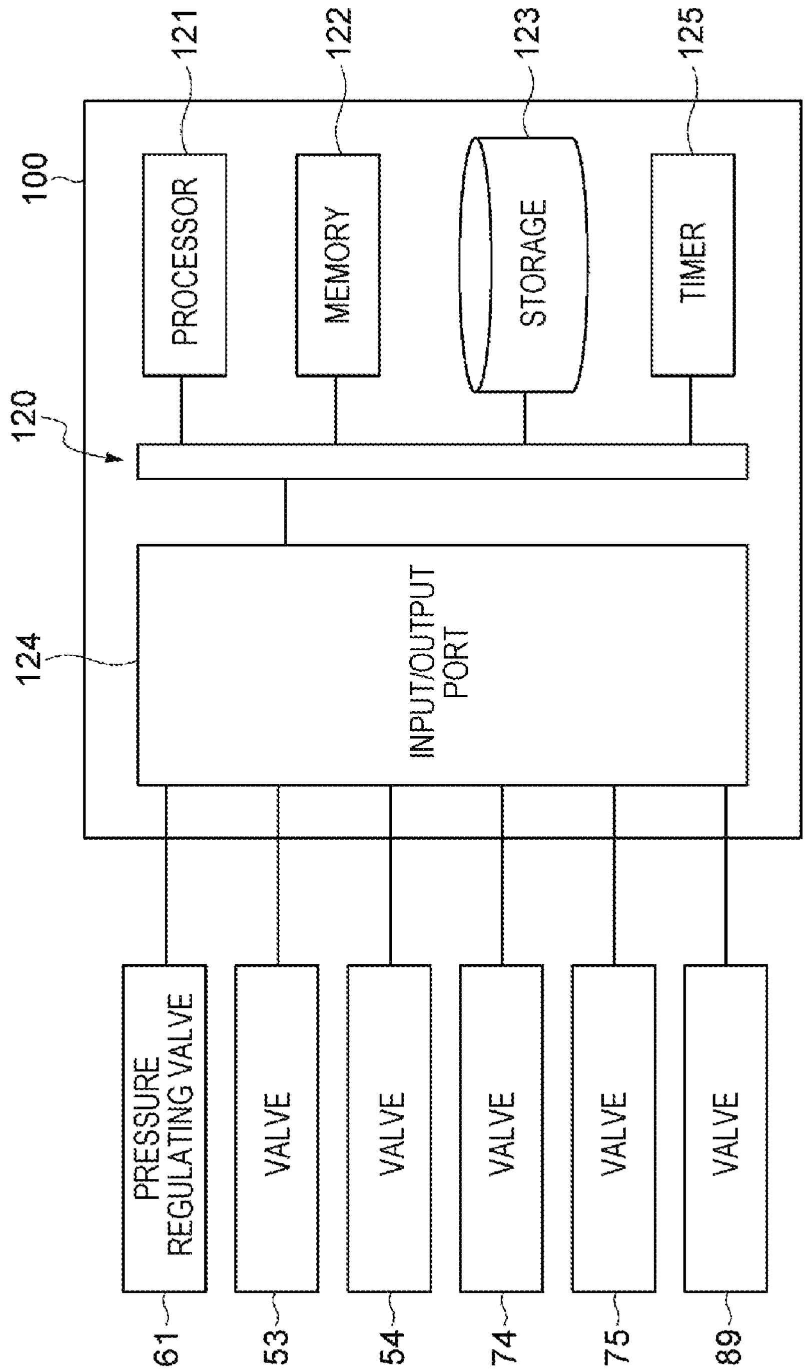
FIG. 7 is a block diagram illustrating a hardware configuration of a controller.

The controller 100 is configured with one or a plurality of control computers. For example, the controller 100 includes a circuit 120 illustrated in FIG. 7. The circuit 120 includes one or a plurality of processors 121, a memory 122, a storage 123, an input/output port 124, and a timer 125.

The input/output port 124 performs input/output of electric signals with respect to the pressure regulating valve 61, the valves 53, 54, 74, 75, and 89, and others. The timer 125 measures elapsed time by, for example, counting a reference pulse having a fixed period. The storage 123 includes a computer-readable storage medium such as, for example, a hard disc. The storage medium stores programs for causing the coating unit 20 to execute the substrate processing procedure to be described later.

The storage medium may be a medium that may be taken out, such as, for example, a nonvolatile semiconductor disc, a magnetic disc, or an optical disc. The memory 122 temporarily stores the programs loaded from the storage medium of the storage 123 and arithmetic operation results by the processors 121. The processors 121 execute the programs in cooperation with the memory 122 so as to implement the above-described respective functional modules.

The hardware configuration of the controller 100 is not necessarily limited to the configuration in which the respective functional modules are implemented by the programs. For example, the respective functional modules of the controller 100 may be implemented by dedicated logic circuits or an application specific integrated circuit (ASIC) in which the dedicated logic circuits are integrated.

[Substrate Processing Procedure]

Subsequently, as an example of the substrate processing method, a processing liquid coating procedure executed by the coating unit 20 according to the control by the controller 100 will be described.

(Processing Liquid Coating Procedure)

Figure 8:
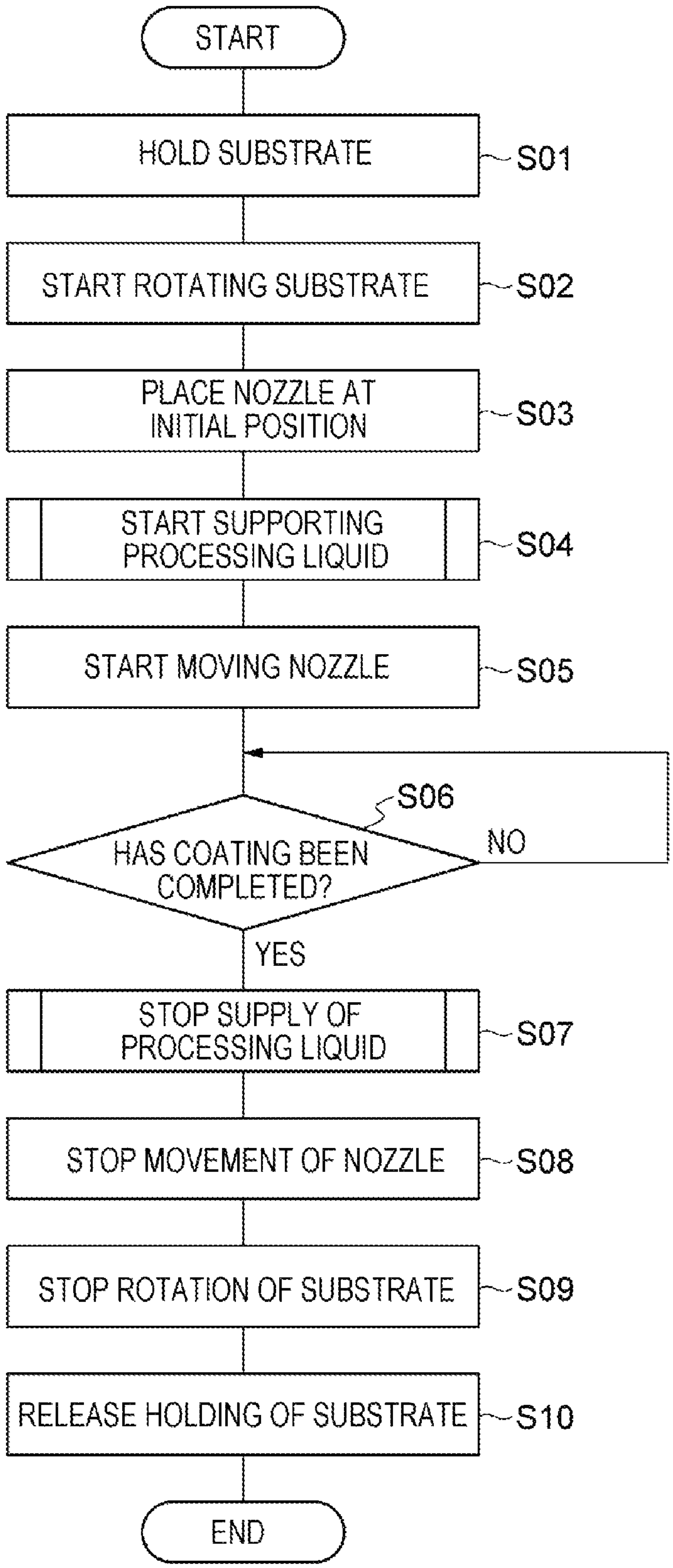
FIG. 8 is a flowchart illustrating a coating control procedure.

As illustrated in FIG. 8, first, the controller 100 performs step S01. In step S01, the rotation controller 112 controls the rotation holding mechanism 21 such that the center of the wafer W that has been carried into the coating unit 20 by the conveyance arm A3 and placed horizontally with the front surface Wa facing upward is held from the lower side by the holding unit 24.

Next, the controller 100 performs step S02. In step S02, the rotation controller 112 controls the rotation holding mechanism 21 to start rotating the holding unit 24 and the wafer W by the rotation driving unit 25.

Next, the controller 100 performs step S03. In step S03, the nozzle movement controller 113 controls the nozzle moving mechanism 23 to dispose the nozzle 22 at the initial position (the position where the supply of the processing liquid is started). For example, the initial position is present vertically above the rotation center RC of the wafer W. In addition, the controller 100 may perform step S03 before performing step S02.

Next, the controller 100 performs step S04. In step S04, the liquid supply controller 111 controls the processing liquid supply unit 30 to start supplying the processing liquid from the nozzle 22 to the front surface Wa of the wafer W. The specific processes of step S04 will be described later.

Next, the controller 100 performs step S05. In step S05, the nozzle movement controller 113 controls the nozzle moving mechanism 23 to start moving the nozzle 22 to the outer peripheral side. When the coating unit 20 includes the above-described liquid contact detecting mechanism 90, the nozzle movement controller 113 may control the nozzle moving mechanism 23 to start the movement of the nozzle 22 after the arrival of the processing liquid is detected by the liquid contact detecting mechanism 90.

Figure 9:
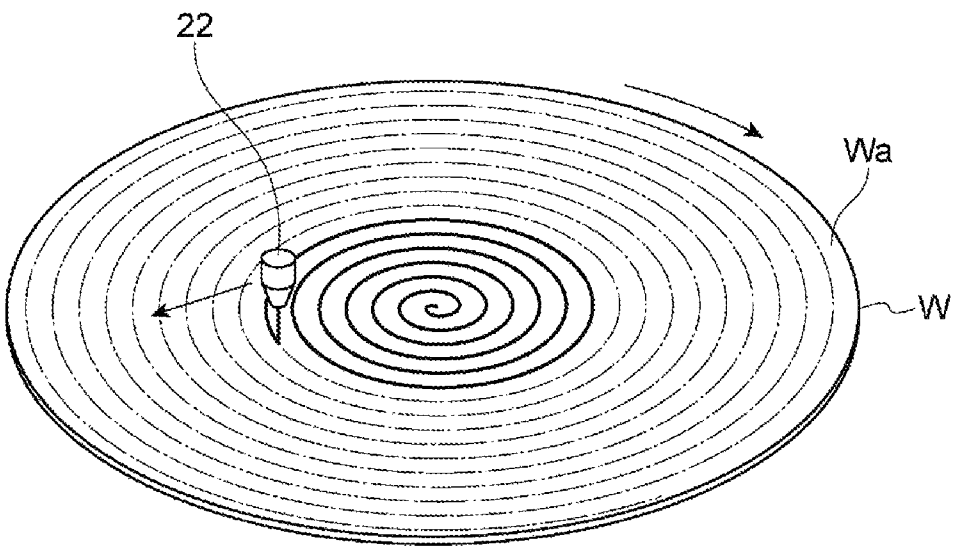
FIG. 9 is a perspective view illustrating a state where a processing liquid is being coated on a substrate.

As illustrated in FIG. 9, the processing liquid ejected from the nozzle 22 is spirally coated on the front surface Wa of the wafer W by the rotation of the wafer W and the movement of the nozzle 22. Thereafter, the rotation controller 112 and the nozzle movement controller 113 may control the rotation speed of the wafer W by the rotation holding mechanism 21 and the movement speed of the nozzle 22, respectively, such that the relative movement speed of the nozzle 22 to the wafer W becomes constant. Here, the term "constant" indicates being substantially constant and falls within a range of an error caused by, for example, a structural factor or a control factor.

Referring back to FIG. 8, next, the controller 100 performs step S06. In step S06, the liquid supply controller 111 waits for the completion of the coating of the processing liquid on the front surface Wa. For example, the liquid supply controller 111 waits until the nozzle 22 reaches the outermost periphery of the range on the front surface Wa to be coated with the processing liquid.

Next, the controller 100 performs step S07. In step S07, the liquid supply controller 111 controls the processing liquid supply unit 30 to stop the supply of the processing liquid from the nozzle 22 to the front surface Wa of the wafer W. Specific processes of step S07 will be described later.

Next, the controller 100 performs step S08. In step S08, the nozzle movement controller 113 controls the nozzle moving mechanism 23 to stop the movement of the nozzle 22. For example, the nozzle movement controller 113 controls the nozzle moving mechanism 23 to stop the movement of the nozzle 22 at a position retreating from the position above the front surface Wa of the wafer W.

Next, the controller 100 performs step S09. In step S09, the rotation controller 112 controls the rotation holding mechanism 21 to stop the rotation of the holding unit 24 and the wafer W by the rotation driving unit 25.

Next, the controller 100 performs step S10. In step S10, the rotation controller 112 releases the holding of the wafer W by the holding unit 24 and brings the wafer W into the state where the wafer W may be carried out by the conveyance arm A3. Thereafter, the conveyance arm A3 carries the wafer W out of the coating unit 20. Accordingly, the processing liquid coating procedure is completed.

The above-described procedure is merely exemplary and may be appropriately modified within a procedure where the processing liquid may be coated on the front surface Wa of the wafer W. For example, in step S03, the initial position may be present vertically above the periphery of the wafer W, and in steps S05 to S07, the nozzle moving mechanism 23 may be controlled to move the nozzle 22 to the rotation center RC side of the wafer W. In addition, without performing the movement of the nozzle 22 in steps S05 to S07, the rotation holding mechanism 21 may be controlled to cause the processing liquid supplied to the rotation center RC of the wafer W to spread toward the outer peripheral side of the wafer W by the centrifugal force.

(Processing Liquid Supply Starting Procedure)

Hereinafter, the processing liquid supply starting procedure in step S04 will be described in detail. Immediately before performing step S04, one of the plurality of force-feeding systems 70 is brought in the above-described active state, and the other force-feeding system 70 is brought in the inactive state. Hereinafter, the tank 71 and the valves 74 and 75 of the force-feeding system 70 in the active state will be simply referred to as the "tank 71" and the "valves 74 and 75," and the valve 53 corresponding to the force-feeding system 70 in the active state will be simply referred to as the "valve 53."

Since all the valves 53, 54, 74, and 75 are closed immediately before performing step 504, the pressure between the valves 53 and 54 (hereinafter, referred to as the "standby pressure") is higher than the pressure between the force-feeding unit 40 and the valve 53. The standby pressure is equal to or lower than the pressure in the tank 71 when the processing liquid is ejected from the nozzle 22 (hereinafter, referred to as the "ejection pressure").

Figure 10:
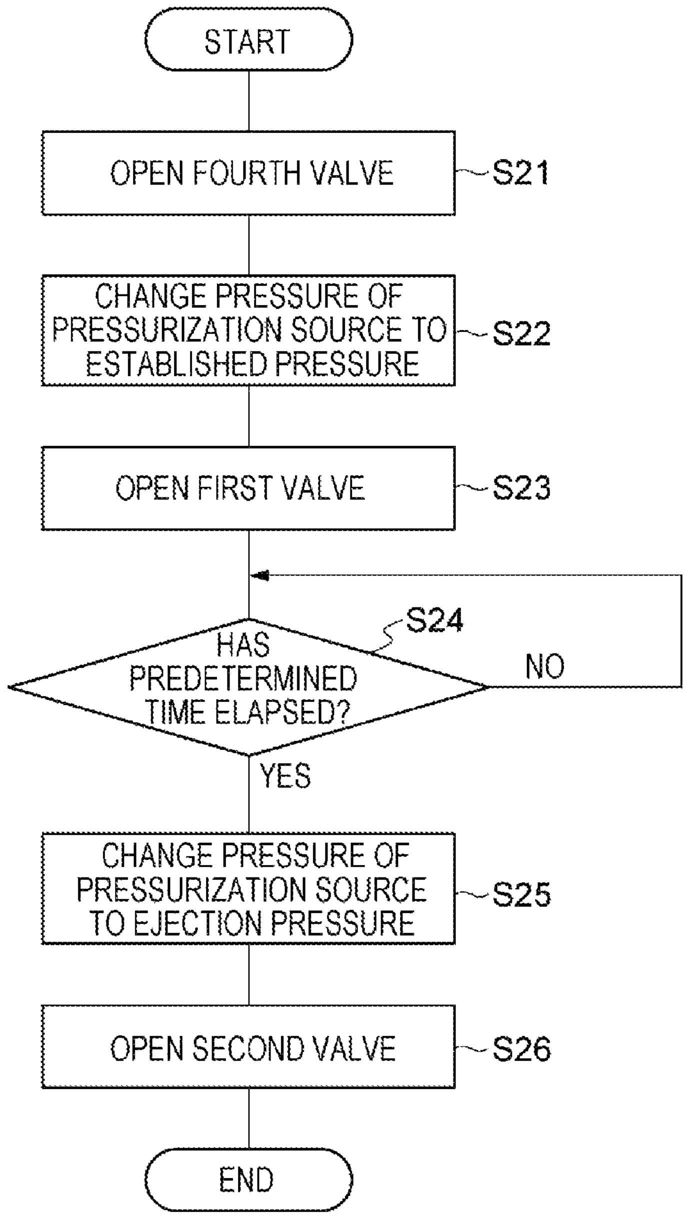
FIG. 10 is a flowchart illustrating a processing liquid supply starting procedure.

As illustrated in FIG. 10, first, the controller 100 performs steps S21 and S22. In step S21, the ejection controller 115 opens the valve 75. In step S22, the pressurization controller 116 controls the pressure regulating valve 61 such that the pressure in the tank 71 becomes a low pressure (hereinafter, referred to as the "established pressure"), as compared with the pressure between the valves 53 and 54 (the standby pressure). The established pressure (a first pressure) may be, for example, equal to or less than 80% of the ejection pressure or equal to or less than 60% of the ejection pressure.

Next, the controller 100 performs step S23. In step S23, the ejection controller 115 opens the valve 53. Immediately before step S23, the pressure between the force-feeding unit 40 and the valve 53 is lower than the pressure between the valves 53 and 54. Thus, when the valve 53 is opened, the processing liquid between the valves 53 and 54 flows toward the force-feeding unit 40 side (hereinafter, this flow will be referred to as the "backflow of the processing liquid"), and as a result, the pressure between the valves 53 and 54 is decreased.

Next, the controller 100 performs step S24. In step S24, the ejection controller 115 waits for elapse of a predetermined time. The predetermined time is optimized to suppress the overshoot of the ejection amount at the time of starting the ejection of the processing liquid from the nozzle 22. The predetermined time may be appropriately set by, for example, a prior condition setting or simulation.

Next, the controller 100 performs step S25. In step S25, the pressurization controller 116 controls the pressure regulating valve 61 to increase the pressure in the tank 71 from the established pressure to the ejection pressure (a third pressure).

As the pressure in the tank 71 is increased, a flow of the processing liquid from the tank 71 to the valve 54 side occurs. Since the flow becomes weak by the above-described backflow of the processing liquid, a sudden inflow of the processing liquid between the valves 53 and 54 is suppressed. Thus, the pressure between the valves 53 and 54 is gently increased.

Next, the controller 100 performs step S26. In step S26, the ejection controller 115 opens the valve 54. Thus, the ejection of the processing liquid from the nozzle 22 is started.

The above-described procedure is merely exemplary and may be appropriately modified within a procedure including opening the valve 53 in the state the valve 54 is closed and the pressure between the valves 53 and 54 is higher than the pressure between the force-feeding unit 40 and the valve 53, controlling the force-feeding unit 40 to increase the pressure between the valves 53 and 54 that has been decreased by the opening of the valve 53, and opening the valve 54 after the pressure between the valves 53 and 54 is decreased by the opening of the valve 53.

For example, the controller 100 may perform step S26 before performing step S25. That is, the ejection controller 115 may open the valve 54 before the pressurization controller 116 controls the pressure regulating valve 61 to change the pressure in the tank 71 from the established pressure to the ejection pressure.

In addition, the controller 100 may perform steps S23 and S24 before performing steps S21 and S22. That is, the ejection controller 115 may open the valve 75 after a predetermined time elapses from the opening of the valve 53. In this case, since the pressure between the valves 53 and 54 may be increased by the opening of the valve 75, the controller 100 may not perform steps S22 and S25.

(Processing Liquid Supply Stopping Procedure)

Figure 11:
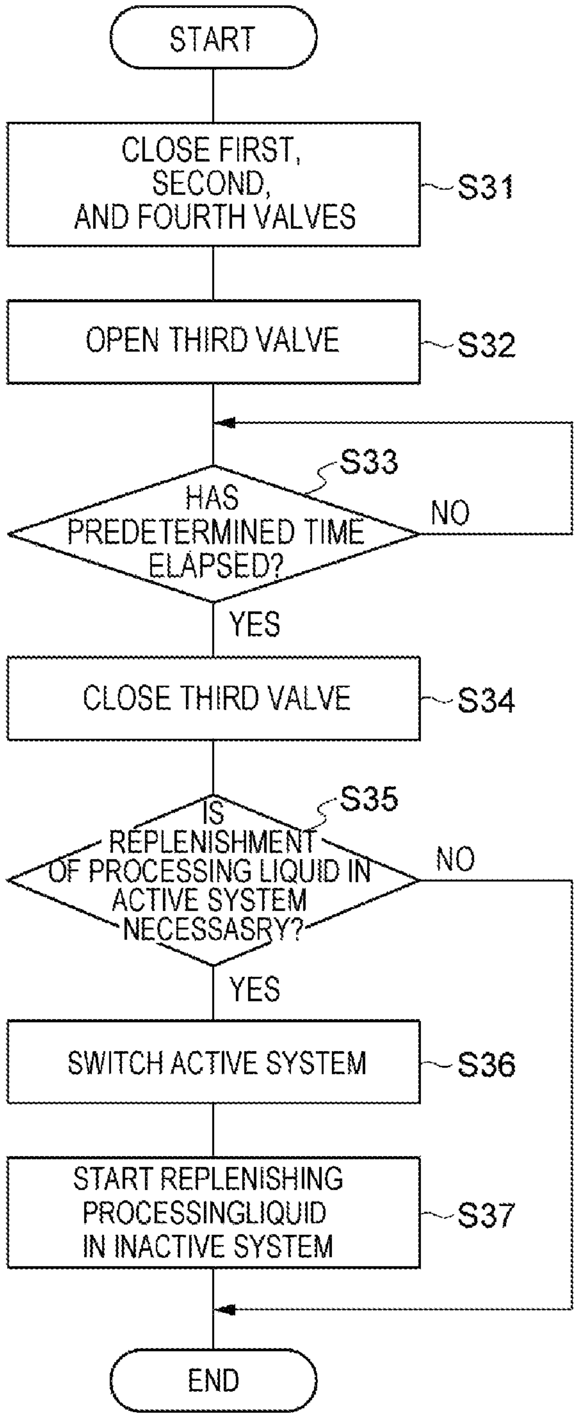
FIG. 11 is a flowchart illustrating a processing liquid supply stopping procedure.

Hereinafter, the processing liquid supply stopping procedure in step S07 will be described in detail. As illustrated in FIG. 11, first, the controller 100 performs step S31. In step S31, the ejection controller 115 closes the valves 53, 54, and 75. As a result, the ejection of the processing liquid from the nozzle 22 is stopped, and the supply of the processing liquid to the front surface Wa of the wafer W is stopped. The procedure described below corresponds to a preparatory procedure for the next supply of the processing liquid.

Next, the controller 100 performs step S32. In step S23, the depressurization controller 117 opens the valve 74. As a result, the pressure in the tank 71 is released, and the pressure between the force-feeding unit 40 and the valve 53 becomes lower than the pressure between the valves 53 and 54.

Next, the controller 100 performs step S33. In step S33, the depressurization controller 117 waits for elapse of a predetermined time. The predetermined time is optimized to sufficiently decrease the pressure between the force-feeding unit 40 and the valve 53. The predetermined time may be appropriately set by, for example, a prior condition setting or simulation.

Next, the controller 100 performs step S34. In step S34, the depressurization controller 117 closes the valve 74. Then, the pressure between the force-feeding unit 40 and the valve 53 is kept lower than the pressure between the valves 53 and 54.

Next, the controller 100 performs step S35. In step S35, the system switch controller 118 determines whether the tank 71 of the force-feeding system 70 currently in the active state (hereinafter, referred to as the "active system") needs be replenished with the processing liquid. For example, the system switch controller 118 confirms whether the remaining amount of the processing liquid in the tank 71 is below the amount necessary for the next supply of the processing liquid.

When it is determined in step S35 that the tank 71 of the active system needs be replenished with the processing liquid, the controller 100 performs step S36. In step S36, the system switch controller 118 switches the active system. That is, the system switch controller 118 switches a force-feeding system 70 to be brought into the active state, among the plurality of force-feeding systems 70. For example, the system switch controller 118 precludes the valve 75 of the force-feeding system 70 that has been in the active state and the valve 53 corresponding to the force-feeding system 70 from being opened/closed. As a result, the force-feeding system 70 is brought into the inactive state. Further, the system switch controller 118 makes the valve 75 of the force-feeding system 70 that has been in the inactive state and the valve 53 corresponding to the force-feeding system 70 openable/closable. As a result, the force-feeding system 70 is brought into the active state.

Next, the controller 100 performs step S37. In step S37, the system switch controller 118 controls the liquid replenishing unit 80 to replenish the processing liquid in the tank 71 of the force-feeding system 70 brought into the inactive state in step S36. For example, the system switch controller 118 opens the valve 89 corresponding to the tank 71 of the force-feeding system 70 brought into the inactive state in step S36, and the valve 88. As a result, the processing liquid is replenished from the tank 81 to the tank 71. Accordingly, the processing liquid supply stopping procedure is completed.

When it is determined in step S35 that the tank 71 of the active system needs not be replenished with the processing liquid, the controller 100 completes the processing liquid supply stopping procedure without performing steps S36 and S37.

[Modification]

Figure 12:
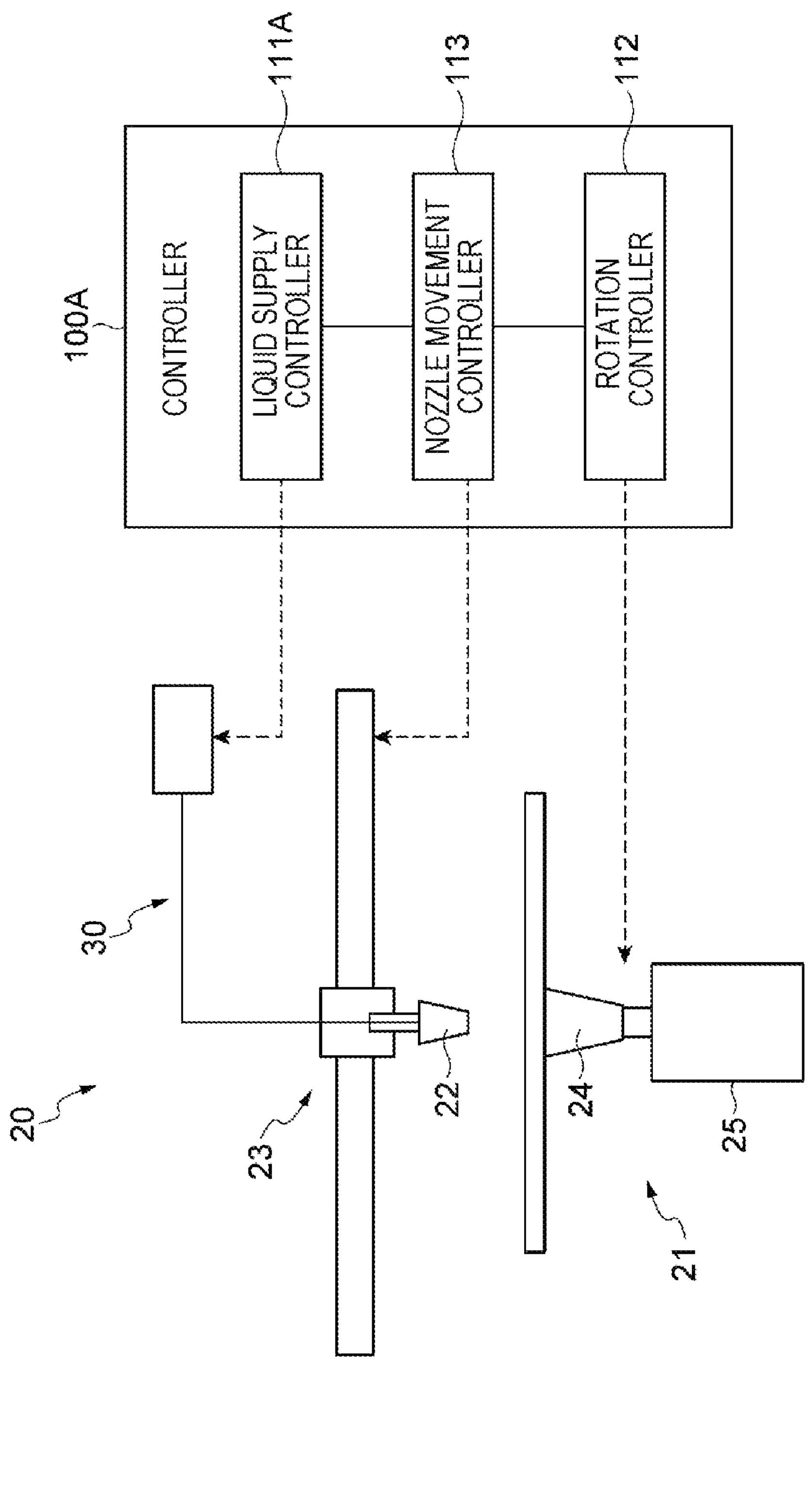
FIG. 12 is a schematic view illustrating a modification of the controller.

Hereinafter, modifications of the controller will be described. FIG. 12 is a schematic view illustrating a modification of the controller. A controller 100A illustrated in FIG. 12 is different from the controller 100 in view of the following points.

i) When controlling the force-feeding unit 40 to make the pressure between the force-feeding unit 40 and the valve 53 lower than the pressure between the valves 53 and 54, the controller 100A controls the pressurizing unit 60 to pressurize the processing liquid in the tank 71 at the first pressure lower than the pressure between the valves 53 and 54.

ii) The controller 100A is configured to further perform controlling the pressurizing unit 60 to pressurize the processing liquid in the tank 71 at the second pressure higher than the first pressure in a state where the valve 53 is opened and the valve 54 is closed, and closing the valve 53 in a state where the pressure between the valves 53 and 54 becomes the second pressure, and performs the controlling the pressurizing unit 60 to pressurize the processing liquid in the tank 71 at the first pressure lower than the pressure between the valves 53 and 54, in the state where the pressure between the valves 53 and 54 becomes the second pressure.

iii) The controller 100A is configured to further perform controlling the pressurizing unit 60 to pressurize the processing liquid in the tank 71 at the third pressure in the state where the valves 53 and 54 are opened. The second pressure is lower than the third pressure.

As exemplified in FIG. 12, the controller 100A includes a liquid supply controller 111A, a rotation controller 112, and a nozzle movement controller 113 as functional modules. The rotation controller 112 and the nozzle movement controller 113 are the same as those of the controller 100.

Figure 13:
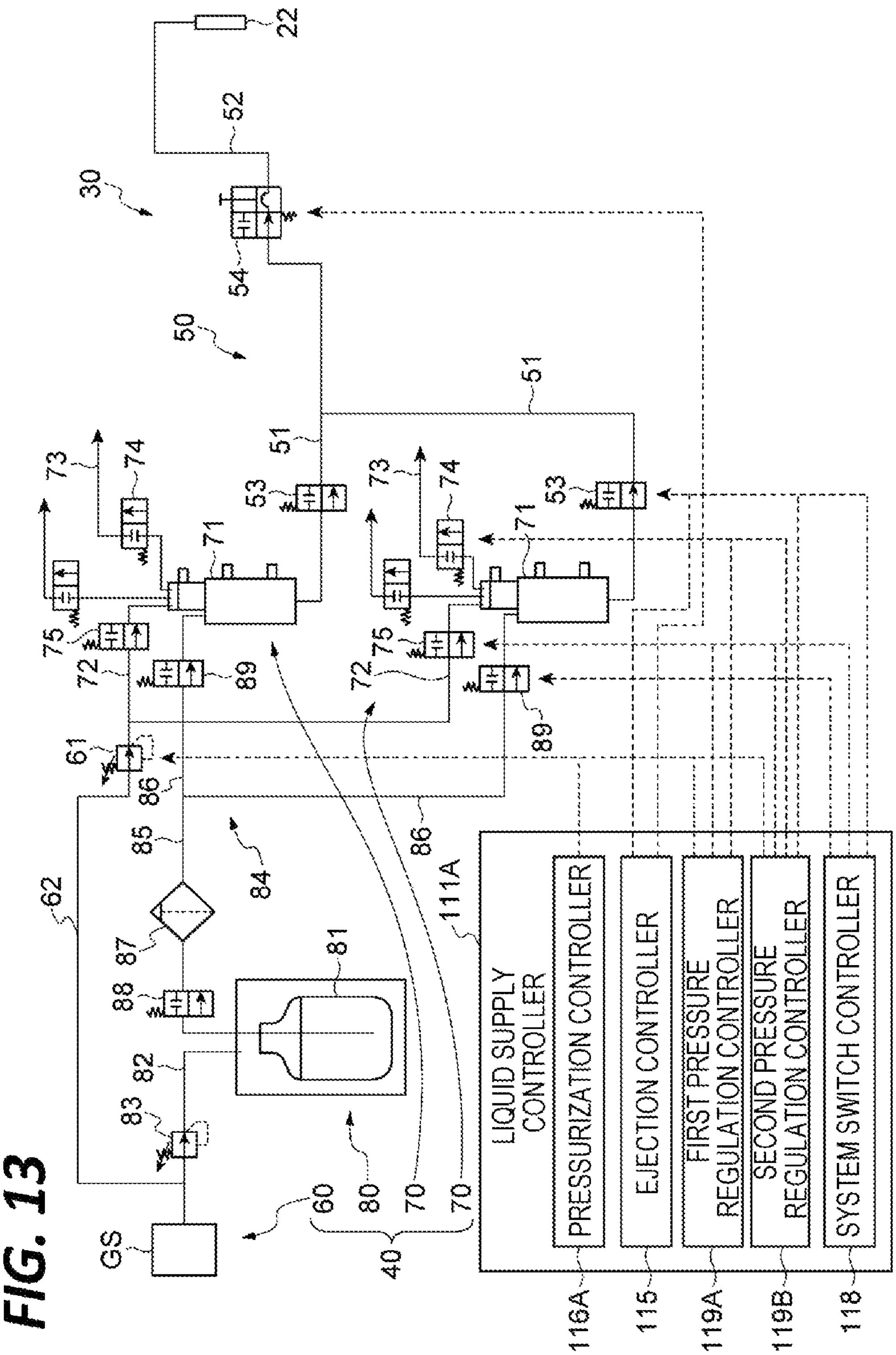
FIG. 13 is a schematic view illustrating a modification of a liquid supply controller.

The liquid supply controller 111A controls the processing liquid supply unit 30 to supply the processing liquid to the nozzle 22. As exemplified in FIG. 13, the liquid supply controller 111A includes an ejection controller 115, a pressurization controller 116A, a system switch controller 118, a first pressure regulation controller 119A, and a second pressure regulation controller 119B as functional modules. The ejection controller 115 and the system switch controller 118 are the same as those of the liquid supply controller 111.

The first pressure regulation controller 119A controls the force-feeding unit 40 to make the pressure between the force-feeding unit 40 and the valve 53 lower than the pressure between the valves 53 and 54, in the state where the valves 53 and 54 are closed. For example, the first pressure regulation controller 119A opens the valve 74 to decrease the pressure in the tank 71. More specifically, the first pressure regulation controller 119A decreases the pressure in the tank 71 by switching the state where the valve 74 is closed and the valve 75 is opened, to the state where the valve 75 is closed and the valve 74 is opened. Then, the first pressure regulation controller 119A controls the pressurizing unit 60 to pressurize the processing liquid in the tank 71 at the first pressure.

The second pressure regulation controller 119B performs controlling the pressurizing unit 60 to pressurize the processing liquid in the tank 71 at the second pressure in the state where the valve 53 is opened and the valve 54 is closed, and closing the valve 53 in the state where the pressure between the valves 53 and 54 becomes the second pressure.

The pressurization controller 116A controls the force-feeding unit 40 to increase the pressure between the valves 53 and 54 that has been decreased by the opening of the valve 53 by the ejection controller 115. For example, the pressurization controller 116A controls the pressurizing unit 60 to make the pressure acting on the processing liquid after the opening of the valve 54 become higher than the pressure acting on the processing liquid before the opening of the valve 54. Further, the pressurization controller 116A controls the pressurizing unit 60 to pressurize the processing liquid in the tank 71 at the third pressure in the state where the valves 53 and 54 are opened.

(Processing Liquid Supply Starting Procedure)

Subsequently, as a modification of the processing liquid supply starting procedure, a processing liquid supply starting procedure performed by the controller 100A will be described.

Figure 14:
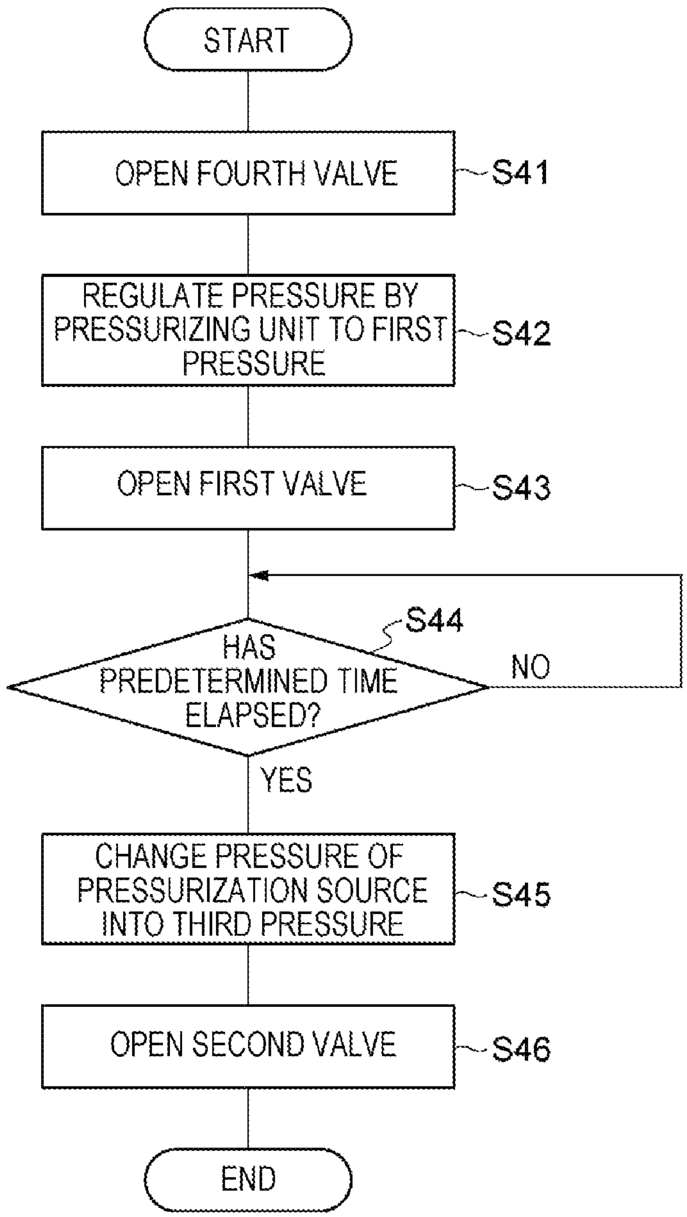
FIG. 14 is a flowchart illustrating a modification of the processing liquid supply starting procedure.

As illustrated in FIG. 14, first, the controller 100A performs steps S41 and S22. In step S41, the ejection controller 115 opens the valve 75 as in step S21. In step S42, the first pressure regulation controller 119A controls the pressure regulating valve 61 such that the pressure in the tank 71 becomes the first pressure (the established pressure) lower than the pressure between the valves 53 and 54 (the standby pressure).

Next, the controller 100A performs step S43. In step S43, the ejection controller 115 opens the valve 53 as in step S23.

Next, the controller 100A performs step S44. In step S44, the ejection controller 115 waits for elapse of a predetermined time as in step S24.

Next, the controller 100A performs step S45. In step S45, the pressurization controller 116A controls the pressure regulating valve 61 to increase the pressure in the tank 71 from the first pressure to the third pressure (the ejection pressure).

Next, the controller 100A performs step S46. In step S46, the ejection controller 115 opens the valve 54 as in step S26. As a result, the ejection of the processing liquid from the nozzle 22 is started. Then, the pressurization controller 116A controls the pressure regulating valve 61 to keep the pressure in the tank 71 at the third pressure. That is, the pressurization controller 116A controls the pressurizing unit 60 to pressurize the processing liquid in the tank 71 at the third pressure, in the state where the valves 53 and 54 are opened.

(Processing Liquid Supply Stopping Procedure)

Subsequently, as a modification of the processing liquid supply stopping procedure, a processing liquid supply stopping procedure performed by the controller 100A will be described.

Figure 15:
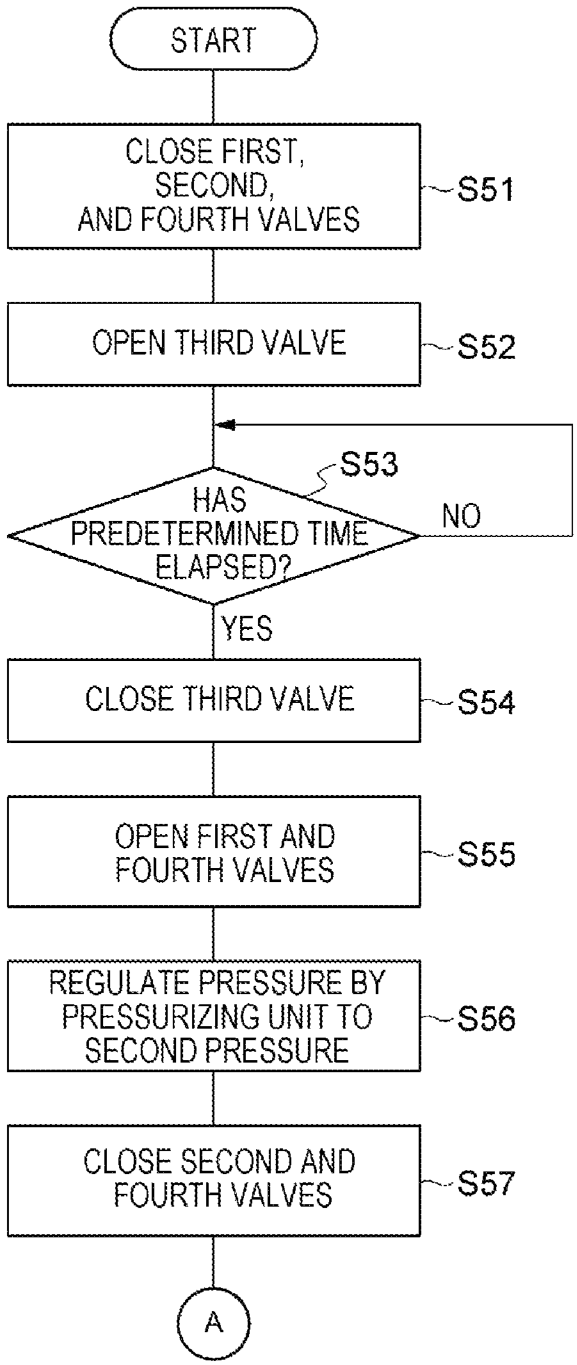
FIG. 15 is a flowchart illustrating a modification of the processing liquid supply stopping procedure.
Figure 16:
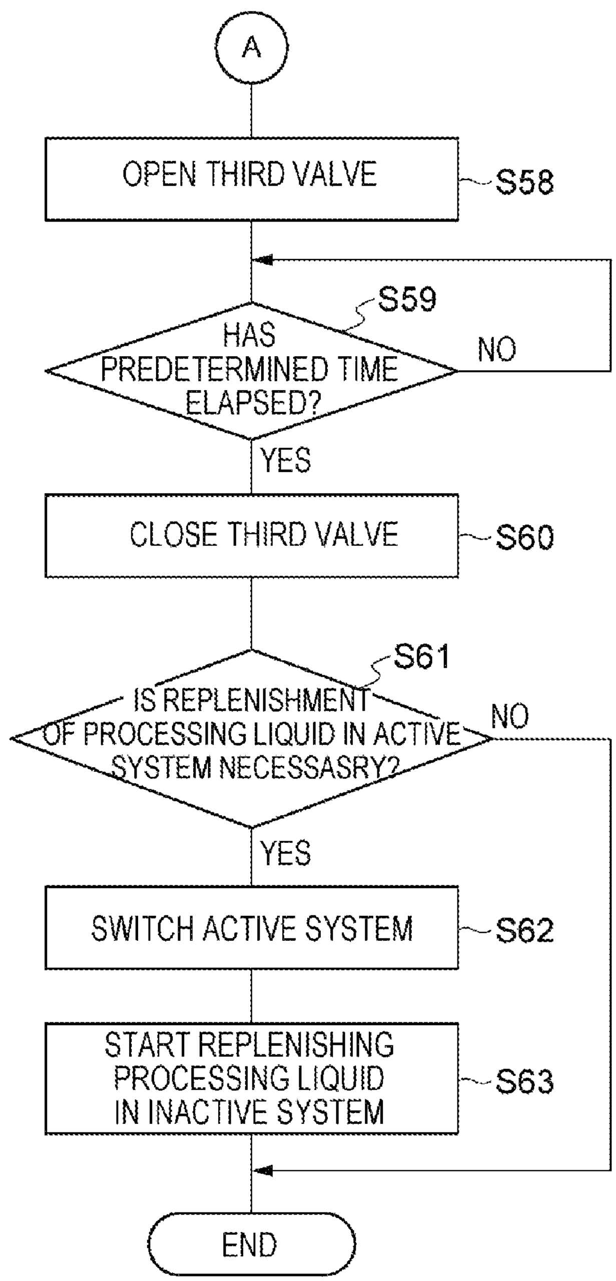
FIG. 16 is a flowchart illustrating another modification of the processing liquid supply stopping procedure.

As illustrated in FIGS. 15 and 16, first, the controller 100A performs step S51. In step S51, the ejection controller 115 closes the valves 53, 54, and 75 as in step S31.

Next, the controller 100A performs step S52. In step S52, the second pressure regulation controller 119B opens the valve 74. As a result, the pressure in the tank 71 is released, and the pressure between the force-feeding unit 40 and the valve 53 becomes lower than the pressure between the valves 53 and 54.

Next, the controller 100A performs step S53. In step S53, the second pressure regulation controller 119B waits for elapse of a predetermined time. The predetermined time is optimized to sufficiently decrease the pressure between the force-feeding unit 40 and the valve 53. The predetermined time may be appropriately set by, for example, a prior condition setting or simulation.

Next, the controller 100A performs step S54. In step S54, the second pressure regulation controller 119B closes the valve 74.

Next, the controller 100A performs step S55. In step S55, the second pressure regulation controller 119B opens the valves 53 and 75.

Next, the controller 100A performs step S56. In step S56, the second pressure regulation controller 119B controls the pressure regulating valve 61 such that the pressure in the tank 71 becomes the second pressure higher than the first pressure. In addition, the controller 100A may start the pressure regulation control of step S56 prior to step S55.

Next, the controller 100A performs step S57. In step S57, the second pressure regulation controller 119B closes the valves 53 and 75.

Next, the controller 100A performs step S58. In step S58, the first pressure regulation controller 119A opens the valve 74. As a result, the pressure in the tank 71 is released, and the pressure between the force-feeding unit 40 and the valve 53 becomes lower than the pressure between the valves 53 and 54.

Next, the controller 100A performs step S59. In step S59, the first pressure regulation controller 119A waits for elapse of a predetermined time. The predetermined time is optimized to sufficiently decrease the pressure between the force-feeding unit 40 and the valve 53. The predetermined time may be appropriately set by, for example, a prior condition setting or simulation.

Next, the controller 100A performs step S60. In step S60, the first pressure regulation controller 119A closes the valve 74.

Next, the controller 100A performs steps S61, S62, and S63. Steps S61, S62, and S63 are the same as steps S35, S36, and S37. Accordingly, the processing liquid supply stopping procedure is completed.

Effects of Exemplary Embodiments

As described above, the coating/developing apparatus 2 includes the nozzle 22 that ejects the processing liquid to the wafer W, the force-feeding unit 40 that force-feeds the processing liquid to the nozzle 22 side, the liquid feeding pipeline 50 that includes the valves 53 and 54 arranged from the force-feeding unit 40 side toward the nozzle 22 side and guides the processing liquid from the force-feeding unit 40 to the nozzle 22, and the controller 100. The controller 100 is configured to perform opening the valve 53 in the state where the valve 54 is closed and the pressure between the valves 53 and 54 is higher than the pressure between the force-feeding unit 40 and the valve 53, controlling the force-feeding unit 40 to increase the pressure between the valves 53 and 54 that has been decreased by the opening of the valve 53, and opening the valve 53 after the pressure between the valves 53 and 54 is decreased by the opening of the valve 53.

According to the coating/developing apparatus 2, since the valve 53 is opened in the state where the pressure between the valves 53 and 54 is higher than the pressure between the force-feeding unit 40 and the valve 53, a backflow of the processing liquid from the valve 53 to the force-feeding unit 40 side occurs so that the pressure between the valves 53 and 54 is decreased. When the force-feeding unit 40 increases the pressure between the valves 53 and 54, a sudden inflow of the processing liquid between the valves 53 and 54 is suppressed by the backflow of the processing liquid. Thus, a rapid increase of the pressure between the valves 53 and 54 is suppressed. As a result, when the valve 54 is opened, the overshoot of the ejection amount of the processing liquid is suppressed. Accordingly, since the ununiformity of the film thickness of the processing liquid that is caused by the overshoot may be suppressed, the uniformity of the film thickness is effectively improved.

The controller 100 may be configured to further perform controlling the force-feeding unit 40 to make the pressure between the force-feeding unit 40 and the valve 53 lower than the pressure between the valves 53 and 54, in the state where the valves 53 and 54 are closed. In this case, the controller 100 may easily perform the opening the valve 53 in the state the pressure between the valves 53 and 54 is higher than the pressure between the force-feeding unit 40 and the valve 53, each time the ejection of the processing liquid from the nozzle 22 is started.

The force-feeding unit 40 includes the tank 71 that accommodates the processing liquid, the pressurizing unit 60 that pressurizes the processing liquid in the tank 71 toward the nozzle 22 side, and the valve 74 that releases the pressure in the tank 71, and the controlling the force-feeding unit 40 to make the pressure between the force-feeding unit 40 and the valve 53 lower than the pressure between the valves 53 and 54 may include opening the valve 74. In this case, by opening the valve 74, the pressure between the force-feeding unit 40 and the valve 53 may be quickly decreased. As a result, the time required for the pressure regulation may be reduced, and thus, the throughput may be improved.

The controlling the force-feeding unit 40 to make the pressure between the force-feeding unit 40 and the valve 53 lower than the pressure between the valves 53 and 54 may include controlling the pressurizing unit 60 to pressurize the processing liquid in the tank 71 at the first pressure lower than the pressure between the valves 53 and 54, and the controller 100 may perform the opening the valve 53 in the state where the valve 54 is closed and the pressure between the valves 53 and 54 is higher than the pressure between the force-feeding unit 40 and the valve 53, in the state where the pressure between the force-feeding unit 40 and the valve 53 becomes the first pressure. In this case, by stabilizing the pressure when opening the valve 53, the reproducibility of the pressure transition of the processing liquid after the opening of the valve 53 until the opening of the valve 54 may be improved. Thus, the effect in improving the uniformity of the film thickness may be more stably implemented.

The controlling the force-feeding unit 40 to increase the pressure between the valves 53 and 54 that has been decreased by the opening of the valve 53 may include controlling the pressurizing unit 60 to make the pressure acting on the processing liquid after the opening of the valve 54 become higher than the pressure acting on the processing liquid before the opening of the valve 54. In this case, by regulating the timing for increasing the pressure between the valves 53 and 54 with the pressurizing unit 60, the rapid increase of the pressure between the valves 53 and 54 may be more reliably suppressed.

As exemplified as the controller 100A, the controller 100 may be configured to further perform controlling the pressurizing unit 60 to pressurize the processing liquid in the tank 71 at the second pressure higher than the first pressure in the state where the valve 53 is opened and the valve 54 is closed, and closing the valve 53 in the state where the pressure between the valves 53 and 54 becomes the second pressure, and may perform the controlling the pressurizing unit 60 to pressurize the processing liquid in the tank 71 at the first pressure lower than the pressure between the valves 53 and 54, in the state where the pressure between the valves 53 and 54 becomes the second pressure. In this case, by stabilizing the pressure when opening the valve 53 at both the portion between the force-feeding unit 40 and the valve 53 and the portion between the valves 53 and 54, the reproducibility of the pressure transition of the processing liquid after the opening of the valve 53 until the opening of the valve 54 may be further improved.

The controller 100 may be configured to further perform controlling the pressurizing unit 60 to pressurize the processing liquid in the tank 71 at the third pressure in the state where the valves 53 and 54 are opened, and the second pressure may be lower than the third pressure. In this case, by suppressing the sudden fluctuation of the pressure when opening the valve 53, the reproducibility of the pressure transition of the processing liquid after the opening of the valve 53 until the opening of the valve 54 may be further improved.

The force-feeding unit 40 may further include the valve 75 to cut off the pressure by the pressurizing unit 60, and the opening the valve 74 may include switching the state where the valve 74 is closed and the valve 75 is opened, to the state where the valve 75 is closed and the valve 74 is opened. In this case, by releasing the pressure in the tank 71 in the state where the pressurization in the tank 71 by the pressurizing unit 60 is cut off, the pressure between the force-feeding unit 40 and the valve 53 may be more quickly decreased.

The force-feeding unit 40 may include the plurality of force-feeding systems 70 each having the tank 71 and the valves 74 and 75, and the liquid feeding pipeline 50 may include a plurality of valves 53 corresponding to the plurality of force-feeding systems 70, respectively. The controller 100 may be configured to further perform switching a force-feeding system 70 in the active state, among the plurality of force-feeding systems 70, by the valves 53 and 75. In this case, by using the valves 53 and 75 for both the switching a force-feeding system 70 in the active state and the regulation of the pressure at the time of starting the ejection of the processing liquid, simplification of the apparatus configuration may be implemented.

The coating unit 20 may further include the rotation holding mechanism 21 that holds and rotates the wafer W, and the nozzle moving mechanism 23 that moves the nozzle 22. The controller 100 may be configured to further perform controlling the rotation holding mechanism 21 and the nozzle moving mechanism 23 to cause the processing liquid ejected from the nozzle 22 to be spirally coated on the wafer W by moving the nozzle 22 while rotating the wafer W. In this case, the formation of the liquid film is implemented by the method of spirally coating the processing liquid on the wafer W (hereinafter, referred to as the "spiral coating method"). In the spiral coating method, the ununiformity of the supply amount of the processing liquid easily affects the uniformity of the film thickness, as compared with the case where the liquid film is formed by the method of causing the processing liquid supplied to the rotation center RC of the wafer W to spread toward the outer peripheral side by the centrifugal force. Thus, when the controller 100 performs the control of the spiral coating method, it is more beneficial to suppress the overshoot of the ejection amount of the processing liquid.

The controlling the rotation holding mechanism 21 and the nozzle moving mechanism 23 to cause the processing liquid ejected from the nozzle 22 to be spirally coated may include controlling the nozzle moving mechanism 23 to move the nozzle 22 starting the ejection of the processing liquid from the rotation center RC toward the outer peripheral side of the wafer W.

When the nozzle 22 is moved from the rotation center RC side to the outer peripheral side of the wafer W, the processing liquid at the time of starting the ejection from the nozzle 22 is coated on the rotation center RC of the wafer W. Thus, it is more beneficial to suppress the overshoot of the ejection amount of the processing liquid.

Further, when the processing liquid is coated by the spiral coating method, the movement speed of the nozzle 22 based on the wafer W is required to be kept constant, in order to improve the uniformity of the film thickness. To this end, it is necessary to increase the rotation speed of the wafer W when supplying the processing liquid to the outer peripheral side of the wafer W, as compared with that when supplying the processing liquid to the rotation center RC of the wafer W. Premising this control, when the nozzle 22 is moved from the outer peripheral side toward the rotation center RC side of the wafer W in order to spirally coat the processing liquid, the centrifugal force acting on the processing liquid supplied to the outer peripheral side of the wafer W is increased as the nozzle 22 approaches the rotation center RC of the wafer W. Thus, a flow of the already coated processing liquid may easily occur. Meanwhile, when the nozzle 22 is moved from the rotation center RC side toward the outer peripheral side of the wafer W, the centrifugal force acting on the processing liquid supplied to the rotation center RC side of the wafer W is decreased as the nozzle 22 is moved to the outer peripheral side of the wafer W. Thus, the flow of the already coated processing liquid hardly occurs. In view of this point as well, moving the nozzle 22 from the rotation center RC side toward the outer peripheral side of the wafer W is effective for improving the uniformity of the film thickness.

The coating unit 20 may further include the liquid contact detecting mechanism 90 to detect the arrival of the processing liquid ejected from the nozzle 22 at the wafer W, and the controlling the rotation holding mechanism 21 and the nozzle moving mechanism 23 to cause the processing liquid ejected from the nozzle 22 to be spirally coated may include controlling the nozzle moving mechanism 23 to start the movement of the nozzle 22 after the arrival of the processing liquid is detected by the liquid contact detecting mechanism 90. In this case, it is possible to suppress the occurrence of the ununiformity of the film thickness near the rotation center RC of the wafer W that is caused when the nozzle 22 is moved before the processing liquid arrives at the wafer W or when the movement of the nozzle 22 is delayed after the processing liquid arrives at the wafer W. Thus, the uniformity of the film thickness may be further improved.

The force-feeding unit 40 may be configured to force-feed the processing liquid having the viscosity of 500 cP to 7,000 cP. When the processing liquid having the viscosity of 500 cP to 7,000 cP is used, a response delay may easily occur in the control of the ejection amount of the processing liquid from the nozzle 22, as compared with the case where the processing liquid having a viscosity lower than the viscosity of 500 cP to 7,000 cP is used, and therefore, the ejection amount may become unstable. Thus, it is more beneficial to suppress the overshoot of the ejection amount of the processing liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:

a nozzle that ejects a processing liquid to a substrate;

a force-feeding unit that force-feeds the processing liquid to the nozzle side;

a liquid feeding pipeline that includes first and second valves arranged from the force-feeding unit side toward the nozzle side and guides the processing liquid from the force-feeding unit to the nozzle; and a controller, wherein the controller is configured to perform opening the first valve in a state where the second valve is closed and a pressure between the first and second valves is higher than a pressure between the force-feeding unit and the first valve, controlling the force-feeding unit to increase the pressure between the first and second valves that has been decreased by the opening of the first valve, and opening the second valve after the pressure between the first and second valves is decreased by the opening of the first valve.

2. The substrate processing apparatus of claim 1, wherein the controller is configured to further perform controlling the force-feeding unit to make the pressure between the force-feeding unit and the first valve lower than the pressure between the first and second valves, in a state where the first and second valves are closed.

3. The substrate processing apparatus of claim 2, wherein the force-feeding unit includes a tank that accommodates the processing liquid, a pressurizing unit that pressurizes the processing liquid in the tank toward the nozzle side, and a third valve configured to release a pressure in the tank, and the controlling the force-feeding unit to make the pressure between the force-feeding unit and the first valve lower than the pressure between the first and second valves includes opening the third valve.

4. The substrate processing apparatus of claim 3, wherein the controlling the force-feeding unit to make the pressure between the force-feeding unit and the first valve lower than the pressure between the first and second valves includes controlling the pressurizing unit to pressurize the processing liquid in the tank at a first pressure lower than the pressure between the first and second valves, and the controller performs the opening the first valve in the state where the second valve is closed and the pressure between the first and second valves is higher than the pressure between the force-feeding unit and the first valve, in a state where the pressure between the force-feeding unit and the first valve becomes the first pressure.

5. The substrate processing apparatus of claim 4, wherein the controlling the force-feeding unit to increase the pressure between the first and second valves that has been decreased by the opening of the first valve includes controlling the pressurizing unit to make a pressure acting on the processing liquid after the opening of the second valve become higher than a pressure acting on the processing liquid before the opening of the second valve.

6. The substrate processing apparatus of claim 4, wherein the controller is configured to further perform controlling the pressurizing unit to pressurize the processing liquid in the tank at a second pressure higher than the first pressure in a state where the first valve is opened and the second valve is closed, and closing the first valve in a state where the pressure between the first and second valves becomes the second pressure, and performs the controlling the pressurizing unit to pressurize the processing liquid in the tank at the first pressure lower than the pressure between the first and second valves, in the state where the pressure between the first and second valves becomes the second pressure.

7. The substrate processing apparatus of claim 6, wherein the controller is configured to further perform controlling the pressurizing unit to pressurize the processing liquid in the tank at a third pressure in a state where the first and second valves are opened, and the second pressure is lower than the third pressure.

8. The substrate processing apparatus of claim 3, wherein the force-feeding unit further includes a fourth valve configured to cut off the pressure by the pressurizing unit, and the opening the third valve includes switching a state where the third valve is closed and the fourth valve is opened to a state where the fourth valve is closed and the third valve is opened.

9. The substrate processing apparatus of claim 8, wherein the force-feeding unit includes a plurality of force-feeding systems each having the tank and the third and fourth valves, the liquid feeding pipeline includes a plurality of first valves corresponding to the plurality of force-feeding systems, respectively, and the controller is configured to further perform switching a force-feeding system that supplies the processing liquid to the nozzle, among the plurality of force-feeding systems, by the first and fourth valves.

10. The substrate processing apparatus of claim 1, further comprising:

a rotation holding mechanism that holds and rotates the substrate; and a nozzle moving mechanism that moves the nozzle, wherein the controller is configured to further perform controlling the rotation holding mechanism and the nozzle moving mechanism to cause the processing liquid ejected from the nozzle to be spirally coated on the substrate by moving the nozzle while rotating the substrate.

11. The substrate processing apparatus of claim 10, wherein the controlling the rotation holding mechanism and the nozzle moving mechanism to cause the processing liquid ejected from the nozzle to be spirally coated includes controlling the nozzle moving mechanism to move the nozzle starting the ejection of the processing liquid from a rotation center to an outer peripheral side of the substrate.

12. The substrate processing apparatus of claim 11, further comprising:

a liquid contact detecting mechanism that detects an arrival of the processing liquid ejected from the nozzle at the substrate, wherein the controlling the rotation holding mechanism and the nozzle moving mechanism to cause the processing liquid ejected from the nozzle to be spirally coated includes controlling the nozzle moving mechanism to start moving the nozzle after the arrival of the processing liquid is detected by the liquid contact detecting mechanism.

13. The substrate processing apparatus of claim 1, wherein the force-feeding unit is configured to force-feed the processing liquid having a viscosity of 500 cP to 7,000 cP.

14. A substrate processing method using a substrate processing apparatus including a nozzle that ejects a processing liquid to a substrate, a force-feeding unit that force-feeds the processing liquid to the nozzle side, a liquid feeding pipeline that includes first and second valves arranged from the force-feeding unit side toward the nozzle side and guides the processing liquid from the force-feeding unit to the nozzle, and a controller, the substrate processing method comprising:

opening the first valve in a state where the second valve is closed, and a pressure between the first and second valves is higher than a pressure between the force-feeding unit and the first valve;

controlling the force-feeding unit to increase the pressure between the first and second valves that has been decreased by the opening of the first valve; and opening the second valve after the pressure between the first and second valves is decreased by the opening of the first valve.

15. The substrate processing method of claim 14, further comprising:

controlling the force-feeding unit to make the pressure between the force-feeding unit and the first valve lower than the pressure between the first and second valves, in a state where the first and second valves are closed.

16. The substrate processing method of claim 15, wherein the force-feeding unit includes a tank that accommodates the processing liquid, a pressurizing unit that pressurizes the processing liquid in the tank toward the nozzle side, and a third valve configured to release a pressure in the tank, and the controlling the force-feeding unit to make the pressure between the force-feeding unit and the first valve lower than the pressure between the first and second valves includes opening the third valve.

17. The substrate processing method of claim 16, wherein the controlling the force-feeding unit to make the pressure between the force-feeding unit and the first valve lower than the pressure between the first and second valves includes controlling the pressurizing unit to pressurize the processing liquid in the tank at a first pressure lower than the pressure between the first and second valves, and the opening the first valve in the state where the second valve is closed and the pressure between the first and second valves is higher than the pressure between the force-feeding unit and the first valve is performed in a state where the pressure between the force-feeding unit and the first valve becomes the first pressure.

18. The substrate processing method of claim 17, wherein the controlling the force-feeding unit to increase the pressure between the first and second valves that has been decreased by the opening of the first valve includes controlling the pressurizing unit to make a pressure acting on the processing liquid after the opening of the second valve become higher than a pressure acting on the processing liquid before the opening of the second valve.

19. The substrate processing method of claim 17, further comprising:

controlling the pressurizing unit to pressurize the processing liquid in the tank at a second pressure higher than the first pressure in a state where the first valve is opened and the second valve is closed, and closing the first valve in a state where the pressure between the first and second valves becomes the second pressure, wherein the controlling the pressurizing unit to pressurize the processing liquid in the tank at the first pressure lower than the pressure between the first and second valves is performed in the state where the pressure between the first and second valves becomes the second pressure.

20. The substrate processing method of claim 19, further comprising:

controlling the pressurizing unit to pressurize the processing liquid in the tank at a third pressure, in a state where the first and second valves are opened, wherein the second pressure is lower than the third pressure.

21. The substrate processing method of claim 15, wherein the processing liquid having a viscosity of 500 cP to 7,000 cP is used.

22. A non-transitory computer-readable storage medium storing a program that, when executed, causes an apparatus to perform the substrate processing method of claim 15.

* * * * *